United States Patent
Shimoe et al.

(10) Patent No.: US 6,792,656 B2
(45) Date of Patent: Sep. 21, 2004

(54) SURFACE ACOUSTIC WAVE APPARATUS AND MANUFACTURING METHOD THEREFOR

(75) Inventors: Kazunobu Shimoe, Kanazawa (JP); Shuji Yamato, Ishikawa-ken (JP); Takashi Marukawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/025,901

(22) Filed: Dec. 26, 2001

(65) Prior Publication Data

US 2002/0121841 A1 Sep. 5, 2002

(30) Foreign Application Priority Data

Dec. 26, 2000 (JP) .......................................... 2000-395515
Sep. 27, 2001 (JP) .......................................... 2001-297021

(51) Int. Cl.[7] .............................................. H01L 41/08
(52) U.S. Cl. .................................. 29/25.35; 310/313 R
(58) Field of Search .................... 29/25.35; 310/313 R, 310/312, 364, 365

(56) References Cited

U.S. PATENT DOCUMENTS 6,367,133 B2 * 4/2002 Ikada et al. ................. 29/25.35
6,516,503 B1 * 2/2003 Ikada et al. ................. 29/25.35
6,518,860 B2 * 2/2003 Ella et al. .................... 333/189
6,557,225 B2 * 5/2003 Takata ......................... 29/25.35

FOREIGN PATENT DOCUMENTS

| EP | 0 878 905 A2 | 11/1998 |
| JP | 56-43816 | 4/1981 |
| JP | 63-127610 | 5/1988 |
| JP | 1-103010 | 4/1989 |
| JP | 11-312943 A | 11/1999 |
| TW | 453027 | 9/2001 |

* cited by examiner

*Primary Examiner*—Mark Budd
(74) *Attorney, Agent, or Firm*—Keating & Bennett, LLP

(57) ABSTRACT

A method for manufacturing a surface acoustic wave apparatus to be mounted via bumps by a flip chip bonding system prevents peeling of electrode pads from the piezoelectric substrate and cracks in the piezoelectric substrate from occurring during the formation of the bumps or at other times during the manufacturing process. In the method of manufacturing a surface acoustic wave apparatus, a first electrode layer of the electrode pad is formed on a piezoelectric substrate by etching, an electrode for a surface acoustic wave element is formed by a lift-off method after the first electrode layer is formed, and thereafter, an electrode film including a second electrode layer of the electrode pad and a wiring electrode is formed.

9 Claims, 20 Drawing Sheets

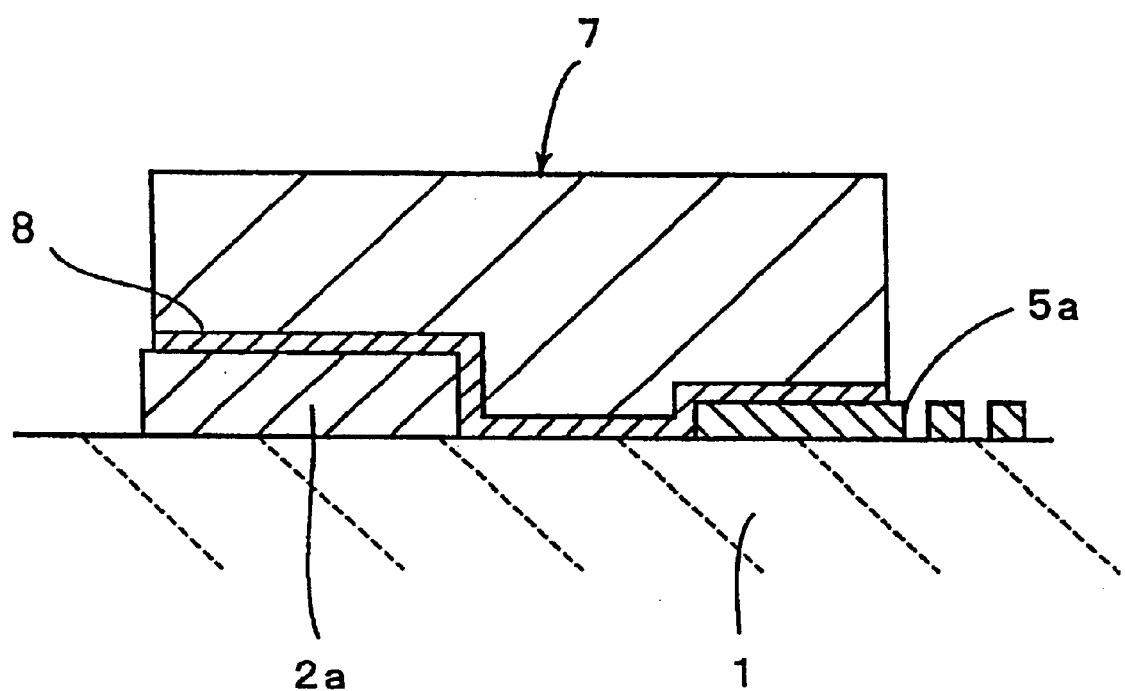

SURFACE ACOUSTIC WAVE APPARATUS AND MANUFACTURING METHOD THEREFOR

BACKGROUND OF THE INVENTION

1. Field of the Invention

The present invention relates to a method of manufacturing a surface acoustic wave apparatus to be mounted using metal bumps by a flip chip bonding system and, also relates to the surface acoustic wave apparatus produced by such a method. In particular, the present invention relates to a method of manufacturing a surface acoustic wave apparatus in which at least one electrode for a surface acoustic wave element is formed by a lift-off method and, also relates to the surface acoustic wave apparatus.

2. Description of the Related Art

In recent years, in order to miniaturize surface acoustic wave apparatuses, the surface acoustic wave apparatuses assembled by a flip chip bonding system have been used widely. In this system, bumps made of Au or other material, are formed at electrode pads on a piezoelectric substrate constituting the surface acoustic wave apparatus, and the electrode pads and input and output electrode pads provided on the package or ground electrode pads are electrically connected via the bumps, and are mechanically joined at the same time.

When the aforementioned flip chip bonding system is used, the bumps not only electrically connect the surface acoustic wave apparatus and the package, but also mechanically fix the surface acoustic wave apparatus to the package. Therefore, it is required that the bumps have a high strength. In addition, the joining strength between the bumps and the electrode pads on the piezoelectric substrate must be high, and the adhesion between the electrode pads and the piezoelectric substrate must be high.

In order to increase the joining strength between the electrode pad and the bump, in general, a method, in which the thickness of the electrode pad is sufficiently increased, has been used. In order to increase the thickness of the electrode pad, a conventional method, in which a second electrode layer having a large film thickness is formed on a first electrode layer having a small film thickness, is known.

On the other hand, when the surface acoustic wave apparatus is formed, electrodes for the surface acoustic wave element, for example, an interdigital transducer, reflector, and wiring electrodes, and the aforementioned electrode pads are formed on the piezoelectric substrate. When the electrode pad includes the first and second electrode layers, in many cases, the electrodes for the surface acoustic wave element and the first electrode layer of the electrode pad are formed simultaneously. As the method for forming the electrode for surface acoustic wave element, (1) an etching method or (2) a lift-off method, has been used. In (1) the etching method, a conductive film primarily containing Al is formed over the entire surface of a substrate, and a desired resist pattern is formed by photolithography. Thereafter, the resulting metal film is processed by wet etching or dry etching, and then, the resist is removed. In (2) the lift-off method, the metal film portion adhered on the resist is removed together with the resist and, therefore, the electrode is formed from the remaining metal film portion.

In particular, regarding some surface acoustic wave filters for use in a 800 MHz band or in a 1 GHz to 2 GHz band, surface acoustic wave apparatuses are formed by the use of the aforementioned (2) lift-off method. An example of the method for manufacturing the aforementioned surface acoustic wave apparatus will now be described with reference to FIGS. 22 to 24.

As shown in FIG. 23A, a resist pattern 102 is formed on a piezoelectric substrate 101 by photolithography. A metal film 103 primarily containing Al is formed on the piezoelectric substrate 101 as shown in FIG. 23B. Subsequently, the resist pattern 102 is removed together with the metal film portion adhered thereon by a lift-off process. Thus, a first electrode layer 103a for constituting an electrode pad and an electrode for the surface acoustic wave element 103b are simultaneously formed on the piezoelectric substrate 101 as shown in FIG. 23C. Then, a resist pattern 104 is formed (FIG. 23D). A metal film 105 is formed as shown in FIG. 24A, and the resist pattern 104 is removed by performing the lift-off process again. Consequently, as shown in FIG. 24B, a second electrode layer 105a is formed on the first electrode layer 103a and, therefore, electrode pads 106 having a double-layer structure can be produced.

Next, as shown in FIG. 22, bumps 107 are joined onto the electrode pads 106. A surface acoustic wave apparatus 108 is joined with a package by a flip chip bonding system using the bumps 107.

Regarding the above-described prior art shown in FIGS. 22 to 24, in the case where the first electrode layer 103a of the electrode pad 106 was formed by the lift-off method, since the adhesion between the piezoelectric substrate 101 and the first electrode layer 103a was relatively weak due to the effects of the resist used for the lift-off, when the formation was performed using bumps 107 by a wire bump bonding method concurrently using ultrasonic waves and heat, sometimes, peeling occurred between the first electrode layer 103a and the piezoelectric substrate 101.

Furthermore, when the surface acoustic wave apparatus 108 was mounted on the package by the flip chip bonding system, and airtight sealing was performed by a covering member, sometimes cracks occurred in the piezoelectric substrate 101 in areas adjacent or near the electrode pads 106 due to the mechanical stress brought about by the residual stress. Therefore, the reliability, especially the reliability of the mechanical strength, of the surface acoustic wave apparatus was significantly degraded.

SUMMARY OF THE INVENTION

In order to overcome the problems described above, preferred embodiments of the present invention provide a method of manufacturing a surface acoustic wave apparatus and a surface acoustic wave apparatus produced by such a method, the apparatus having superior reliability, and in which the adhesion between the electrode pad and the piezoelectric substrate is very high, peeling of the electrode pad from the piezoelectric substrate is prevented from occurring, and cracks are prevented from being generated during the mounting on the package by the flip chip bonding system.

In addition, preferred embodiments of the present invention provide a method of manufacturing a surface acoustic wave apparatus and a surface acoustic wave apparatus, the apparatus having superior reliability in the electrical connection of electrode pads and electrodes for surface acoustic wave element with the wiring electrodes.

In accordance with preferred embodiments of the present invention, a surface acoustic wave apparatus is preferably a type that is mounted via bumps by a flip chip bonding system.

According to a first preferred embodiment of the present invention, a method of manufacturing a surface acoustic wave apparatus includes the steps of preparing a piezoelectric substrate, forming a first electrode layer of an electrode pad on the piezoelectric substrate, forming at least one electrode for a surface acoustic wave element after the step of forming the first electrode layer, forming a second electrode layer of the electrode pad after the step of forming the electrode for the surface acoustic wave element, and forming a wiring electrode for electrically connecting the electrode pad and the electrode for surface acoustic wave element. Therefore, an electrode forming process that is ideal for forming each of the electrode pad and the surface acoustic wave element is provided.

Regarding the method of manufacturing according to the first preferred embodiment of the present invention, the wiring electrode for electrically connecting the second electrode layer and the electrode for surface acoustic wave element may be simultaneously formed with the second electrode layer. In this case, since the wiring electrode can be simultaneously formed with the second electrode layer, the reliability in the electrical connection between the electrode pad and the wiring electrode can be increased, and the simplification of the manufacturing steps can be achieved.

The method of manufacturing according to the first preferred embodiment of the present invention preferably includes the step of forming an adhesive layer as a substrate prior to the formation of the wiring electrode and the second electrode layer, wherein the wiring electrode and the second electrode layer are preferably made of Al or Al alloy, and the adhesive layer is preferably made of metal or an alloy having adhesion to the first electrode layer higher than that of Al or Al alloy.

By forming the aforementioned adhesive layer as the substrate layer, the adhesion of the second electrode layer to the first electrode layer can be further increased and, therefore, peeling of the electrode pad from the piezoelectric substrate and occurrence of cracks in the piezoelectric substrate during formation of the bumps and during mounting by the flip chip bonding system are reliably prevented.

The method of manufacturing according to the first preferred embodiment of the present invention may further include the step of performing etching in order to make stepwise end surfaces at joint portions, to be connected with the wiring electrodes, of the electrode for the surface acoustic wave element and the electrode pad, after the step of forming the electrode for surface acoustic wave element, wherein the wiring electrode, for electrically connecting the electrode for surface acoustic wave element and the first electrode layer of the electrode pad, and the second electrode layer of the electrode pad may be simultaneously formed from the same conductive film. Consequently, the reliability of the electrical connection between the wiring electrodes and the electrode for the surface acoustic wave element and the electrode pad is greatly increased.

Regarding the method of manufacturing according to the first preferred embodiment of the present invention, each of the electrode for the surface acoustic wave element and the first electrode layer of the electrode pad may have at least two end surfaces of the joint portion and, therefore, the reliability in the electrical connection is even more increased.

Regarding the method of manufacturing according to the first preferred embodiment of the present invention, the electrode for the surface acoustic wave element to be connected with the electrode pad may be formed such that the end surface of the electrode for surface acoustic wave element is in contact with the first electrode layer of the electrode pad in the step of forming the electrode for the surface acoustic wave element. In this case, since the end surface of the electrode for the surface acoustic wave element to be connected with the electrode pad is formed to contact with the first electrode layer of the electrode pad, the reliability of the electrical connection between the wiring electrodes and the electrode for the surface acoustic wave element and the electrode pad is greatly increased.

Regarding the method of manufacturing according to the first preferred embodiment of the present invention, a particle diameter of a conductive particle in the conductive film constituting the wiring electrode and the second electrode layer is preferably smaller than a particle diameter of a conductive particle in one of the electrode for the surface acoustic wave element and the first electrode layer, which has a smaller film thickness. Consequently, the reliability of the electrical connection is even more increased.

Regarding the method of manufacturing according to the first preferred embodiment of the present invention, the electrode for the surface acoustic wave element may be preferably formed by a lift-off method, and the first electrode layer of the electrode pad may be preferably formed by etching. In this case, the electrode for the surface acoustic wave element and the first electrode layer of the electrode pad can be formed with high precision, and furthermore, occurrence of cracks in the piezoelectric substrate at areas near the electrode pad can be prevented even more reliably.

Regarding the method of manufacturing according to the first preferred embodiment of the present invention, at least one electrode for a second surface acoustic wave element that is different from the aforementioned electrode for the surface acoustic wave element may be simultaneously formed with the first electrode layer during the step of forming the first electrode layer. In this case, since the electrode for the second surface acoustic wave element having a thickness different from that of the aforementioned electrode for surface acoustic wave element can be formed very easily, surface acoustic wave elements having different characteristics can be formed with ease on the piezoelectric substrate.

According to a second preferred embodiment of the present invention, a surface acoustic wave apparatus is provided. The surface acoustic wave apparatus includes a piezoelectric substrate, at least one electrode for a surface acoustic wave element disposed on the piezoelectric substrate, an electrode pad disposed on the piezoelectric substrate and arranged to be joined with a bump, and a wiring electrode for electrically connecting the electrode pad and the electrode for the surface acoustic wave element, wherein the electrode pad includes a first electrode layer disposed on the piezoelectric substrate and a second electrode layer laminated on the first electrode layer, the first electrode layer is formed by etching of a metal film, and at least one electrode for the surface acoustic wave element is formed by a lift-off method. Therefore, peeling of the electrode pad from the piezoelectric substrate and occurrence of cracks in the piezoelectric substrate due to the external force applied during the formation of the bumps and during the mounting on the package by the flip chip bonding system or other suitable system, is reliably prevented.

Regarding the surface acoustic wave apparatus according to the second preferred embodiment of the present invention, the wiring electrode and the second electrode layer may be integrally formed from the same metal film. In this case, the reliability of the electrical connection between the electrode pad and the wiring electrode can be increased, and the manufacturing steps are greatly simplified.

The surface acoustic wave apparatus according to the second preferred embodiment of the present invention may further include an adhesive layer as a substrate for the wiring electrode and the second electrode layer, wherein the wiring electrode and the second electrode layer are preferably made of Al or Al alloy or other suitable material, and the adhesive layer is preferably made of metal or alloy or other suitable material having adhesion to the first electrode layer higher than that of Al or Al alloy. Since the aforementioned adhesive layer is formed as the substrate layer, the adhesion of the second electrode layer to the first electrode layer can be further increased and, therefore, peeling of the electrode pad from the piezoelectric substrate and occurrence of cracks in the piezoelectric substrate during formation of the bumps and during mounting by the flip chip bonding system are prevented even more reliably.

According to a third preferred embodiment of the present invention, another surface acoustic wave apparatus to be mounted via bumps by a flip chip bonding system is provided. The surface acoustic wave apparatus according to this preferred embodiment preferably includes a piezoelectric substrate, at least one electrode for a surface acoustic wave element disposed on the piezoelectric substrate, an electrode pad disposed on the piezoelectric substrate and arranged to be joined with the bump, and a wiring electrode for electrically connecting the electrode pad and the electrode for surface acoustic wave element, wherein the electrode pad includes a first electrode layer disposed on the piezoelectric substrate and a second electrode layer laminated on the first electrode layer, the second electrode layer and the wiring electrode are integrally formed from the same conductive film, and end surfaces of joint portions, to be electrically connected with the wiring electrodes, of the first electrode layer and the electrode for surface acoustic wave element are arranged in a stepwise configuration. Therefore, the reliability of the electrical connection of the wiring electrodes between the electrode pad including the first and second electrode layers and the electrode for the surface acoustic wave element is effectively increased.

Regarding the surface acoustic wave apparatus according to the third preferred embodiment of the present invention, each of the electrode for the surface acoustic wave element and the first electrode layer of the electrode pad may have at least two end surfaces of the joint portion. In this case, the reliability of the electrical connection between the electrode for the surface acoustic wave element and the first electrode layer of the electrode pad is further increased.

According to a fourth preferred embodiment of the present invention, another surface acoustic wave apparatus to be mounted via bumps by a flip chip bonding system is provided. The surface acoustic wave apparatus according to this preferred embodiment preferably includes a piezoelectric substrate, at least one electrode for a surface acoustic wave element disposed on the piezoelectric substrate, an electrode pad which is disposed on the piezoelectric substrate and is arranged to be joined with the bump, and a wiring electrode for electrically connecting the electrode pad and the electrode for surface acoustic wave element, wherein the electrode pad includes a first electrode layer disposed on the piezoelectric substrate and a second electrode layer laminated on the first electrode layer, the second electrode layer and the electrode for the surface acoustic wave element are integrally formed from the same conductive film, and the electrode for the surface acoustic wave element and the first electrode layer of the electrode pad, to be connected with the electrode for the surface acoustic wave element, are arranged in contact with each other. Therefore, the reliability of the electrical connection between the electrode for the surface acoustic wave element and the electrode pad is greatly increased.

Regarding the surface acoustic wave apparatus according to the fourth preferred embodiment of the present invention, a particle size of a conductive particle in the conductive film constituting the second electrode layer and the wiring electrode may be smaller than a particle diameter of a conductive particle in one of the electrode for the surface acoustic wave element and the first electrode layer of the electrode pad, which has a smaller film thickness. Consequently, the reliability of the electrical connection of the electrode for surface acoustic wave element and the electrode pad with the wiring electrodes is even more increased.

Regarding the surface acoustic wave apparatuses according to the second to fourth preferred embodiments of the present invention, an electrode for a second surface acoustic wave element that is different from the aforementioned electrode for the surface acoustic wave element may be formed on the piezoelectric substrate, and the electrode for the second surface acoustic wave element may be formed by etching of a metal film. When the electrode for the second surface acoustic wave element is formed by the etching method, it can be simultaneously formed with the first electrode layer of the electrode pad, and the film thickness thereof can be differentiated with ease from that of the electrode for the surface acoustic wave element formed by the lift-off method. Therefore, surface acoustic wave elements having different characteristics can be formed with ease on the piezoelectric substrate.

Other features, elements, characteristics and advantages of the present invention will become more apparent from the following detailed description of preferred embodiments with reference to the attached drawings.

BRIEF DESCRIPTION OF THE DRAWINGS

FIG. 9 is a sectional front view of a portion of a preferable modified example based on the first preferred embodiment of the present invention.

DETAILED DESCRIPTION OF PREFERRED EMBODIMENTS

The present invention will be made clear by describing below specific preferred embodiments according to the present invention with reference to the drawings.

Figure 1:
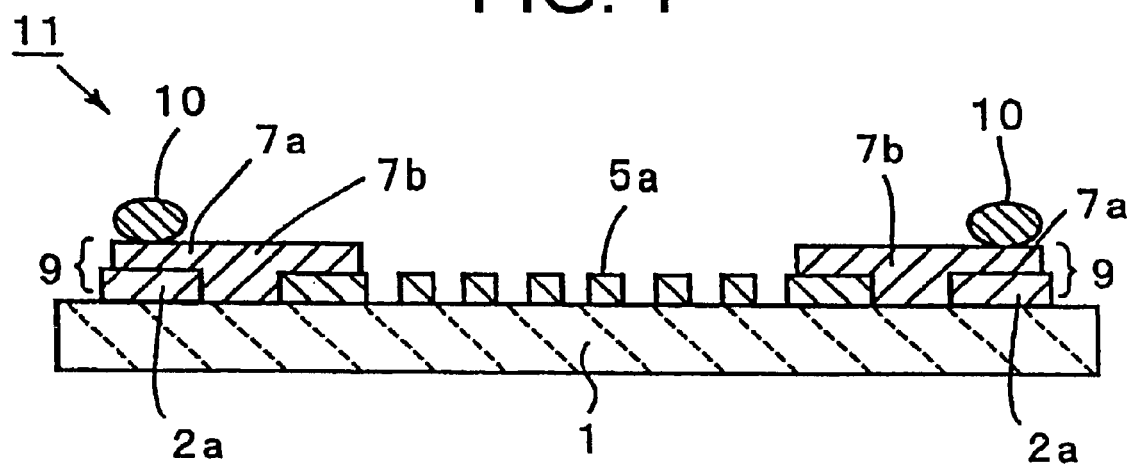
FIG. 1 is a sectional front view of a surface acoustic wave apparatus according to a first preferred embodiment of the present invention.

FIG. 1 is a sectional view of a surface acoustic wave apparatus according to a first preferred embodiment of the present invention. Each of FIG. 2 to FIG. 4 is a sectional view for explaining the method of manufacturing a surface acoustic wave apparatus according to the first preferred embodiment of the present invention.

Figure 2A:
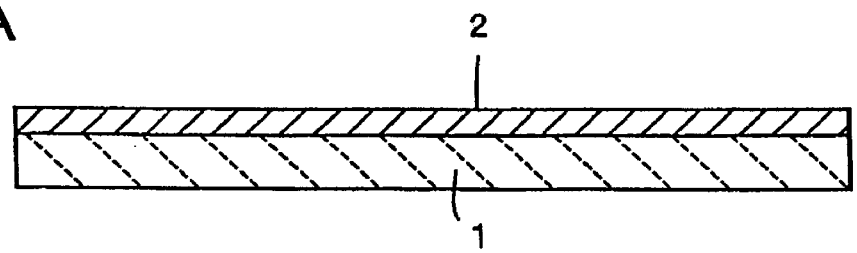
FIGS. 2A to 2D are sectional front views for explaining the steps in the manufacture of the surface acoustic wave apparatus according to the first preferred embodiment of the present invention.

Regarding the present preferred embodiment, as shown in FIG. 2A, a metal film 2 is formed over the entire surface of a piezoelectric substrate 1. As the piezoelectric substrate 1, although not specifically limited, a piezoelectric single crystal, for example, $LiTaO_3$, $LiNbO_3$, or quartz, or a piezoelectric ceramic, for example, lead titanate zirconate ceramic, or other suitable material, is preferably used. In the present preferred embodiment, the piezoelectric substrate 1 is preferably made of $LiTaO_3$. Although the metal film 2 is preferably made of an Al alloy in the present preferred embodiment, it may be formed using other metal or alloy, for example, Cu. The metal film 2 is formed by vapor deposition of the Al alloy in the present preferred embodiment. The thickness of the metal film 2 is not specifically limited, although it is usually specified to be about 5 nm to about 1,000 nm. The method for forming the metal film 2 is not limited to vapor deposition, and the metal film 2 may be formed by plating, sputtering, or other suitable process.

Figure 2B:
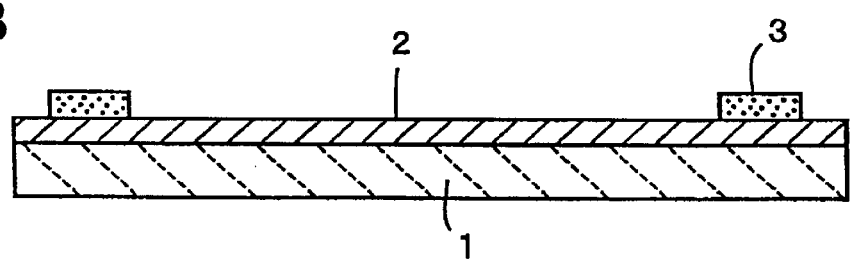

Then, a resist pattern 3 corresponding to the shape of a first electrode layer of an electrode pad of a surface acoustic wave apparatus is preferably formed by photolithography (FIG. 2B). The resist pattern 3 is formed from a publicly known photoresist material.

Figure 2C:
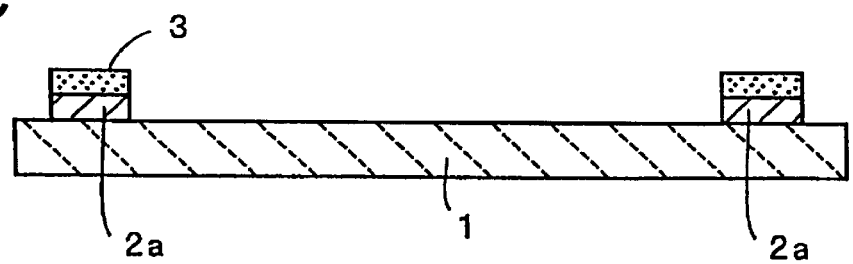

The undesired portion of the metal film 2 is removed by wet etching or dry etching (FIG. 2C).

Figure 2D:
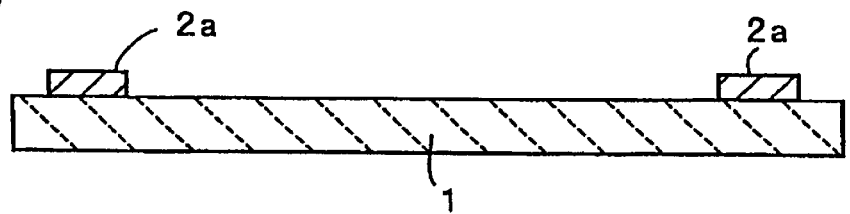

The resist pattern 3 is removed by the use of a solvent. Consequently, as shown in FIG. 2D, the first electrode layer 2a constituting the electrode pad is disposed on the piezoelectric substrate 1.

Figure 3A:
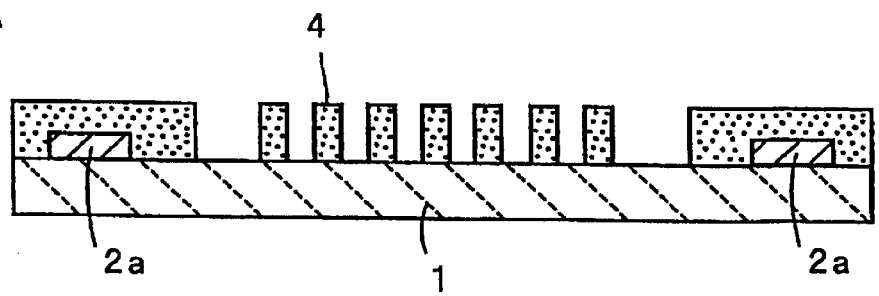
FIGS. 3A to 3D are sectional front views for explaining the steps in the manufacture of the surface acoustic wave apparatus according to the first preferred embodiment of the present invention.

Thereafter, as shown in FIG. 3A, a resist pattern 4 is preferably formed by photolithography. The resist pattern 4 is applied to the region except where an electrode for the surface acoustic wave element is formed.

Figure 3B:
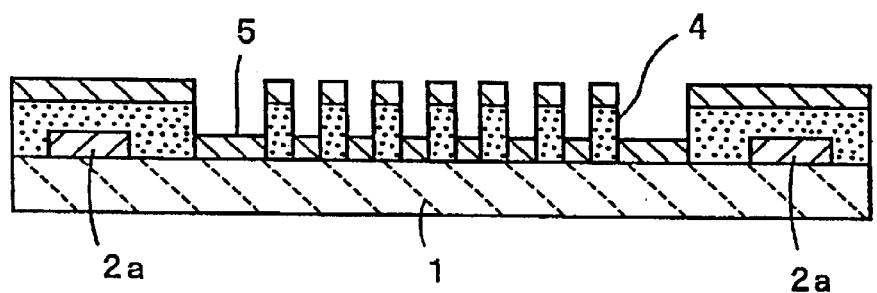

Subsequently, in order to form the electrode for the surface acoustic wave element over the entire top surface of the piezoelectric substrate 1, a metal film 5 is formed (FIG. 3B). In the present preferred embodiment, the metal film 5 is preferably made of the Al alloy, and the film thickness thereof is usually specified to be within the range of about 5 nm to about 1,000 nm according to the frequency and bandwidth of the surface acoustic wave element.

The electrode for surface acoustic wave element includes not only interdigital transducers, but also other electrodes that are electrodes other than electrode pads and function as surface acoustic wave elements, such as reflectors (not shown in the drawings) provided if necessary.

Regarding the method for forming the metal film 5, although vapor deposition is carried out in the present preferred embodiment, other thin film making methods, for example, sputtering and plating, may be carried out.

Figure 3C:
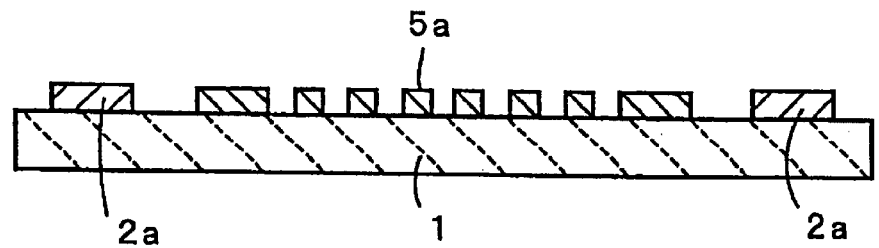

Thereafter, the resist pattern 4 is preferably removed by the lift-off method. As a result, an electrode for the surface acoustic wave element 5a is formed on the piezoelectric substrate 1 as shown in FIG. 3C.

Figure 3D:
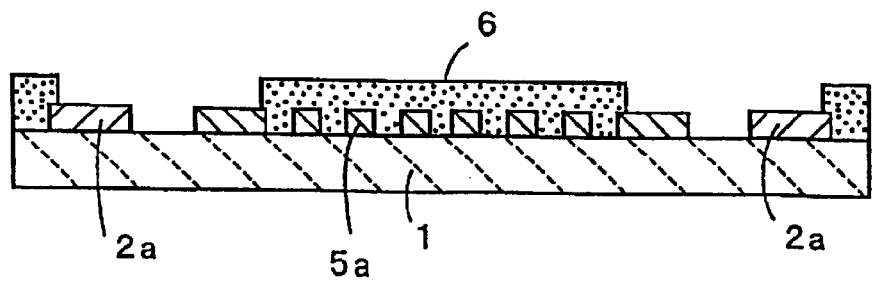

A resist pattern 6 is formed as shown in FIG. 3D. The resist pattern 6 is applied to the region except where a second electrode layer of the electrode pad and a wiring electrode are formed.

Figure 4A:
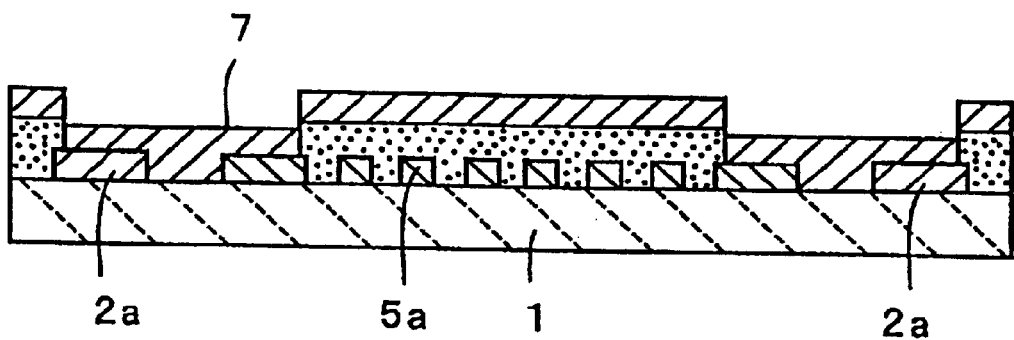
FIGS. 4A and 4B are sectional front views for explaining the steps in the manufacture of the surface acoustic wave apparatus according to the first preferred embodiment of the present invention.

A metal film 7 is formed over the entire surface of the piezoelectric substrate 1 as shown in FIG. 4A. The metal film 7 is preferably made of the Al alloy, and is preferably formed by vapor deposition. However, it may be formed from other metals or alloy, for example, Cu, other than the Al alloy. Furthermore, the metal film 7 may be formed by plating, sputtering, or other thin film making method other than the vapor deposition.

The thickness of the metal film 7 is preferably larger than that of the first electrode layer 2a in consideration of the wiring resistance and the joining strength between the bump and the electrode pad. The thickness of the metal film 7 is usually specified to be within the range of about 300 nm to about 10,000 nm.

Preferably, an adhesive layer 8 is formed as a substrate layer prior to the formation of the metal film 7, as shown in FIG. 9 under magnification. The metal film 7 is formed after the formation of the adhesive layer 8. The adhesive layer 8 is preferably made of metal or alloy having adhesion higher than that of Al or Al alloy. The examples of the metal materials used for constituting the adhesive layer 8 include metals, for example, Ti, Ni, and a Ni—Cr alloy, having adhesion to the piezoelectric substrate 1 and first electrode layer 2a higher than that of the metal film 7.

Figure 4B:
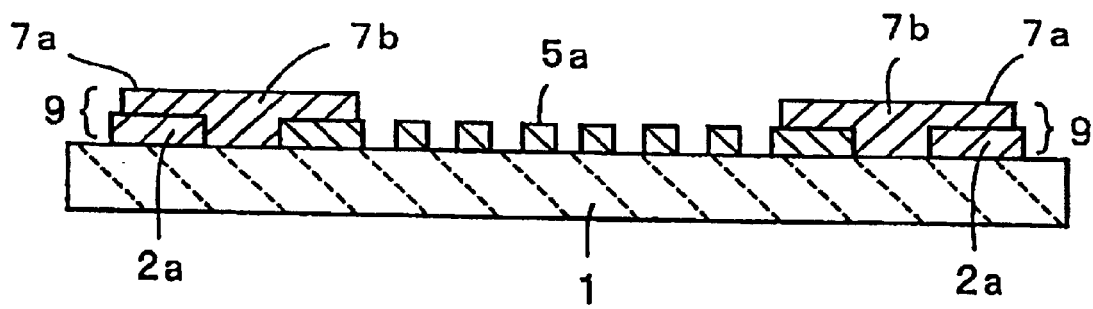

Then, as shown in FIG. 4B, the resist pattern 6 is removed by the lift-off method. Consequently, a second electrode layer 7a is formed, an electrode pad 9 including the first and second electrode layers 2a and 7a is formed, and at the same time, a wiring electrode 7b for electrically connecting the electrode pad 9 and an electrode for the surface acoustic wave element 5a is formed.

In the present preferred embodiment, although the second electrode layer 7a and the wiring electrode 7b are simultaneously formed from the same metal material, while these are being joined to each other, the wiring electrode 7b may be formed by a separate step.

Subsequently, the bumps 10 are formed on the electrode pads 9 (refer to FIG. 1). Thus, a surface acoustic wave apparatus 11 shown in FIG. 1 is produced.

The bumps 10 are preferably formed by a wire bump bonding method concurrently using ultrasonic waves and heat, and the bumps 10 are preferably formed from Au in the present preferred embodiment.

The surface acoustic wave apparatus 11 produced as described above is contained in a package in order that the top surface side shown in FIG. 1 is arranged as the bottom surface, that is, the bumps 10 are in contact with the electrode pads of the package, and therefore, electrical and mechanical joining is achieved by the use of the bumps 10. Thereafter, the package is sealed airtight with a covering member or other suitable cover, so as to provide a surface acoustic wave apparatus component.

In the aforementioned conventional manufacturing method for a surface acoustic wave apparatus, as is shown in FIG. 23, the first electrode layer 103a was formed by the lift-off method. In that case, since the resist pattern 102 was formed prior to the formation of the metal film 103, the top surface of the piezoelectric substrate 1 was inevitably soiled. Therefore, the adhesion of the first electrode layer 103a to the piezoelectric substrate 101 is degraded.

In the surface acoustic wave apparatus 11 according to the present preferred embodiment, the first electrode layer 2a constituting the electrode pad 9 is formed beforehand preferably by the etching method. Therefore, since the metal film 2 is formed on the piezoelectric substrate 1 so as to intimately contact with the piezoelectric substrate, and thereafter, the first electrode layer 2a is formed by etching, the adhesion of the first electrode layer 2a to the piezoelectric substrate 1 is greatly increased.

Since the adhesion of the first electrode layer 2a to the piezoelectric substrate 1 is increased, peeling between the electrode pad 9 and the piezoelectric substrate 1 is prevented from occurring, and the occurrence of cracks in the piezoelectric substrate 1 can be prevented during the formation of the bumps 10. This will now be described using specific examples.

Figure 22:
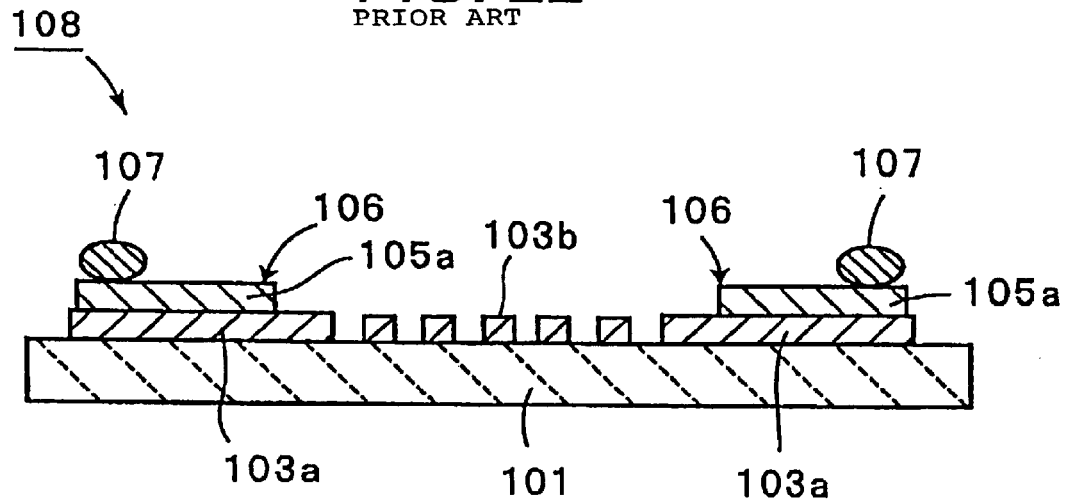
FIG. 22 is a sectional front view for explaining a conventional surface acoustic wave apparatus.
Figure 23A:
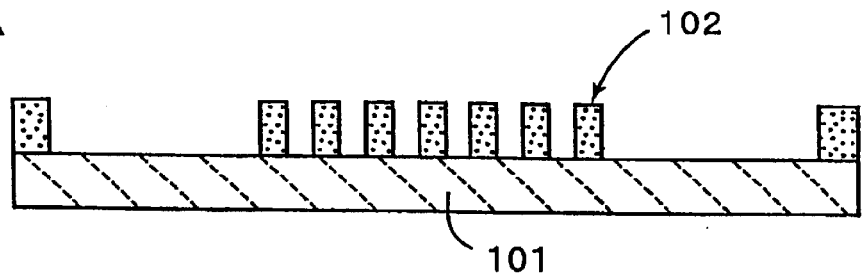
FIGS. 23A to 23D are sectional front views for explaining the steps in the manufacture of the conventional surface acoustic wave apparatus shown in FIG. 22.
Figure 23B:
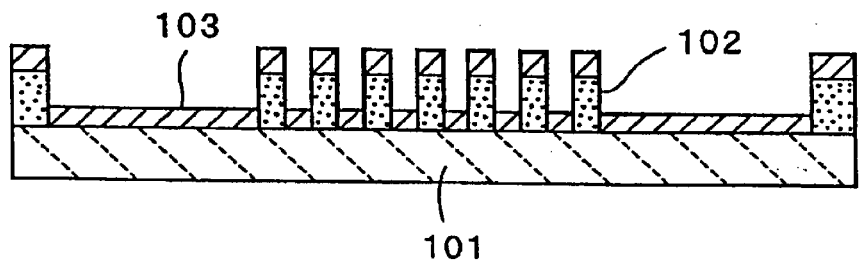
Figure 23C:
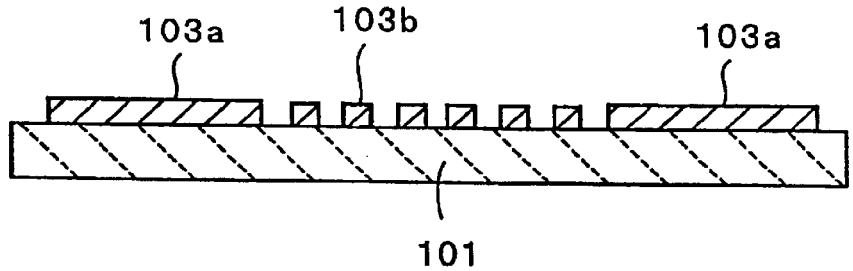
Figure 23D:
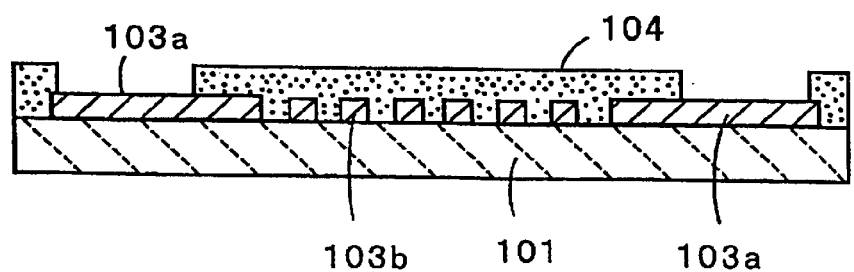
Figure 24A:
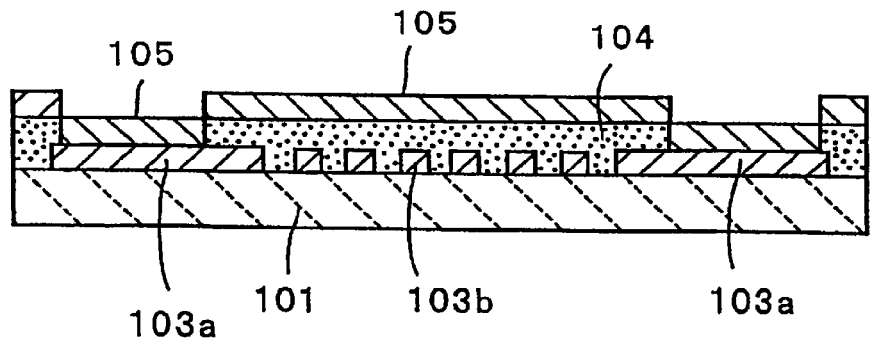
FIGS. 24A and 24B are sectional front views for explaining the steps in the manufacture of the conventional surface acoustic wave apparatus shown in FIG. 22.
Figure 24B:
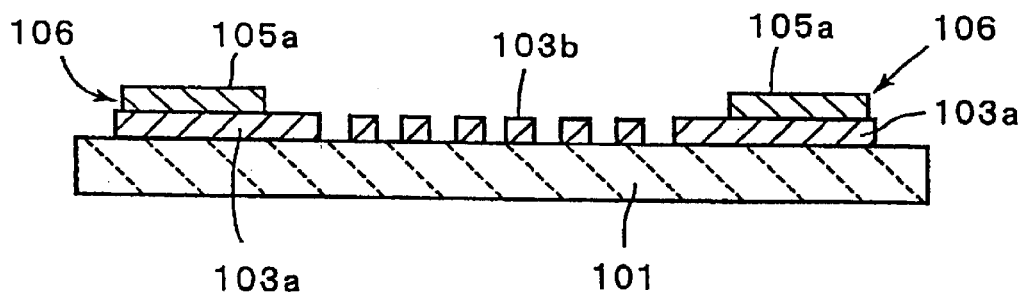
Figure 25:
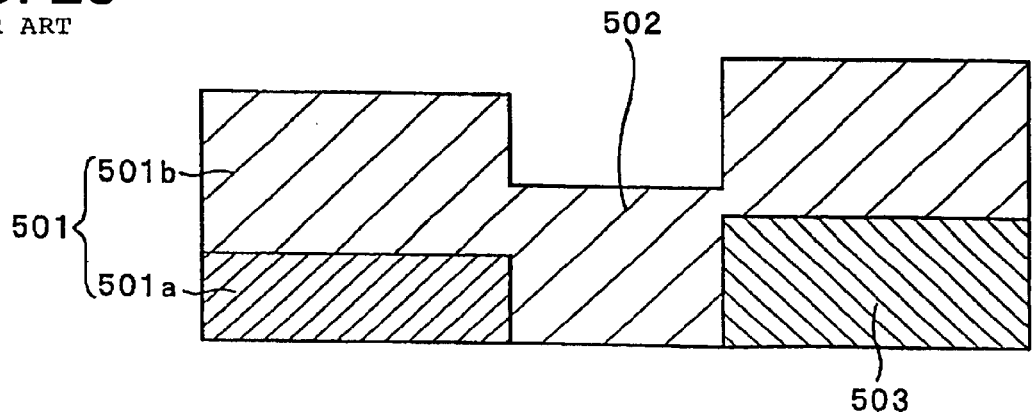
FIG. 25 is a partial sectional view for explaining problems in the manufacturing method for the conventional surface acoustic wave apparatus.

In the examples, a surface acoustic wave apparatus in which the first electrode layer 2a is formed by wet etching, a surface acoustic wave apparatus in which the first electrode layer 2a is formed by dry etching, and for purposes of comparison, a surface acoustic wave apparatus in which the first electrode layer is formed by the conventional method as shown in FIGS. 22 to 24 were produced separately. Regarding each of these surface acoustic wave apparatuses, the peeling rate of the electrode pad from the piezoelectric substrate and the crack occurrence rate in the piezoelectric substrate during the formation of the bump made of Au were examined. The results are shown in the following Table 1.

The electrode pad peeling rate refers to a rate of occurrence of peeling between the electrode pad and the piezoelectric substrate during the formation of the bump. The crack occurrence rate refers to a total number of surface acoustic wave apparatuses in which cracks have occurred in the piezoelectric substrate in areas near the electrode pad relative to a total number of finished products. The crack occurs in the piezoelectric substrate in areas near the electrode pad due to mechanical stresses, such as a residual stress, and occurs depending on the materials and shapes of the bump, electrode pad, piezoelectric substrate, and other factors, in addition to the joining conditions during the flip chip bonding.

Regarding the evaluation of the aforementioned electrode pad peeling rate and crack occurrence rate, the bumps were formed by the wire bump bonding method concurrently using ultrasonic waves and heat. As the piezoelectric substrate, a 36° $LiTaO_3$ substrate was used. The thicknesses of the electrode for the surface acoustic wave element and the first electrode layer were about 200 nm, and the thicknesses of the second electrode layer and the wiring electrode were about 840 nm. In each of the two kinds of surface acoustic wave apparatuses of the examples, a NiCr alloy layer having a thickness of about 10 nm was formed as an adhesive layer.

In the conventional example, a plasma cleaning treatment was performed between the steps shown in FIGS. 23A and 23B, that is, before the vapor deposition of the metal film 103, and therefore, soils on the piezoelectric substrate 101 were removed. This method is commonly used as a method for helping increase adhesion between the first electrode layer 103a of the electrode pad and the piezoelectric substrate 101, and for reducing the aforementioned electrode pad peeling rate.

TABLE 1

| Electrode pad forming process | Electrode pad peeling rate during bump formation (%) | Crack occurrence rate (%) |
| --- | --- | --- |
| Wet process | 0 | 0 |
| Dry process | 0 | 0 |
| Lift-off process | 0.5 to 1.0 | 12 |

As is clear from Table 1, regarding the conventional manufacturing method for the surface acoustic wave apparatus, in spite of plasma cleaning being performed, the electrode pad peeling rate is about 0.5% to about 1.0%, and the crack occurrence rate is about 12%. On the other hand, regarding either the case where the wet etching and dry etching are used, the electrode pad peeling rate and the crack occurrence rate are 0% when the manufacturing method according to the present preferred embodiment of the present invention is applied.

The reasons for this will be described now. In the conventional method, (1) since the piezoelectric substrate is coated with the resist by the lift-off process, the first electrode layer cannot be formed on the piezoelectric substrate with high enough adhesion strength even when the plasma cleaning treatment is performed, and (2) in the lift-off process, when the metal film made of Al is formed, there are limitations in the film making conditions, for example, the film making temperature must be determined in consideration of the heat resistance of the resist, and consequently, properties of the electrode film, for example, hardness of the electrode layer, are varied and, therefore, peeling of the electrode pad and generation of the cracks are likely to occur.

Figure 5:
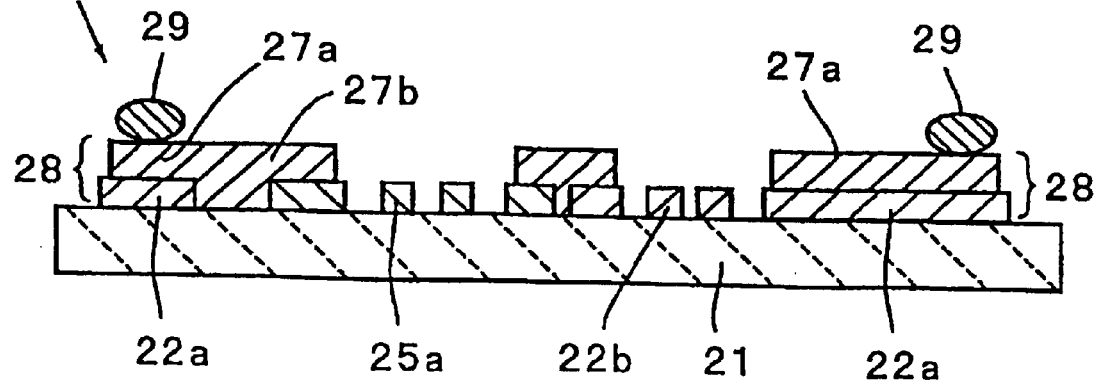
FIG. 5 is a sectional front view of a surface acoustic wave apparatus according to a second preferred embodiment of the present invention.

Each of FIG. 5 to FIG. 8 is a sectional view for explaining the method of manufacturing a surface acoustic wave apparatus according to the second preferred embodiment of the present invention. In the second preferred embodiment of the present invention, a surface acoustic wave apparatus shown in FIG. 5 is produced.

Figure 6A:
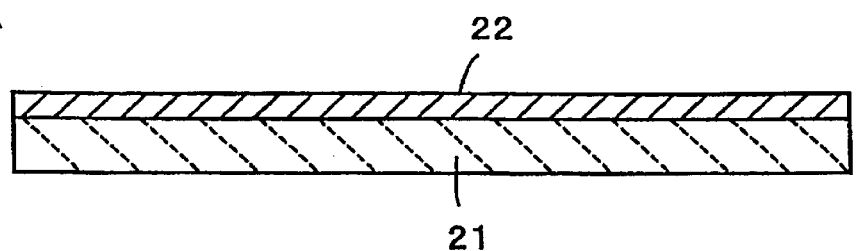
FIGS. 6A to 6D are sectional front views for explaining the steps in the manufacture of the surface acoustic wave apparatus according to the second preferred embodiment of the present invention.

As shown in FIG. 6A, a metal film 22 is preferably formed over the entire surface of the piezoelectric substrate 21 by vapor deposition. This step is carried out in a manner similar to that in the case where the metal film 2 is formed on the piezoelectric substrate 1 in the first preferred embodiment of the present invention.

Figure 6B:
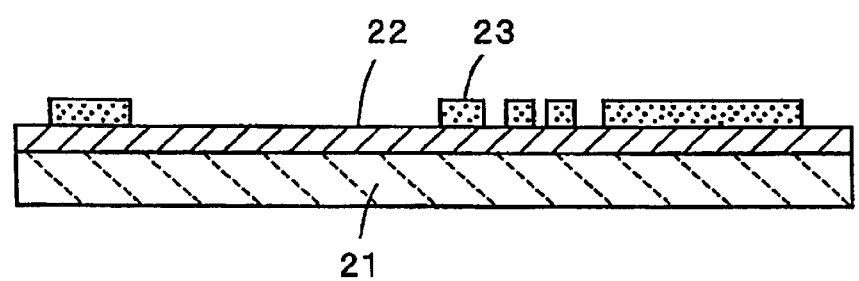

Then, as shown in FIG. 6B, a resist pattern 23 is preferably formed by photolithography. In the second preferred embodiment, two surface acoustic wave elements are formed on the piezoelectric substrate 21. The resist pattern 23 is formed to be located on the portion where an electrode for a first surface acoustic wave element is to be formed and on the portion where the first electrode layer of the electrode pad is to be formed.

Figure 6C:
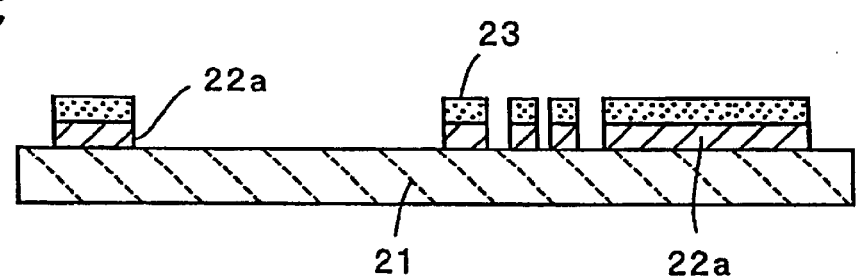

The metal film 22 is etched preferably by dry etching or wet etching (FIG. 6C).

Figure 6D:
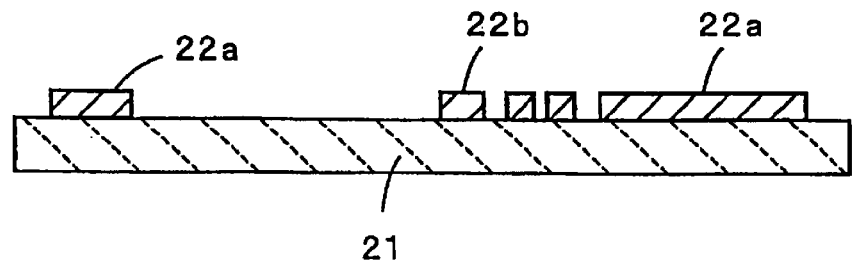

The resist pattern 23 is removed. Thus, the first electrode layer 22a for constituting an electrode pad and the electrode for the first surface acoustic wave element 22b are formed on the piezoelectric substrate 21 as shown in FIG. 6D.

Figure 7A:
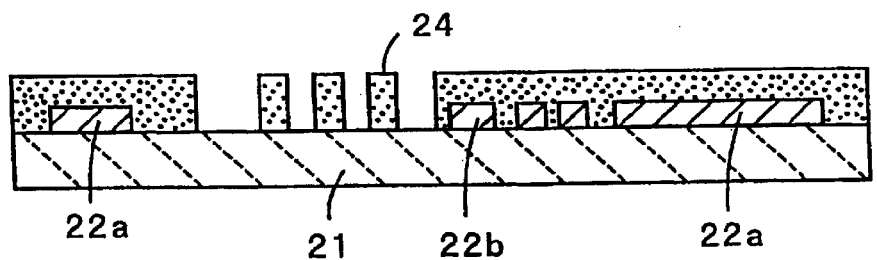
FIGS. 7A to 7D are sectional front views for explaining the steps in the manufacture of the surface acoustic wave apparatus according to the second preferred embodiment of the present invention.
Figure 7B:
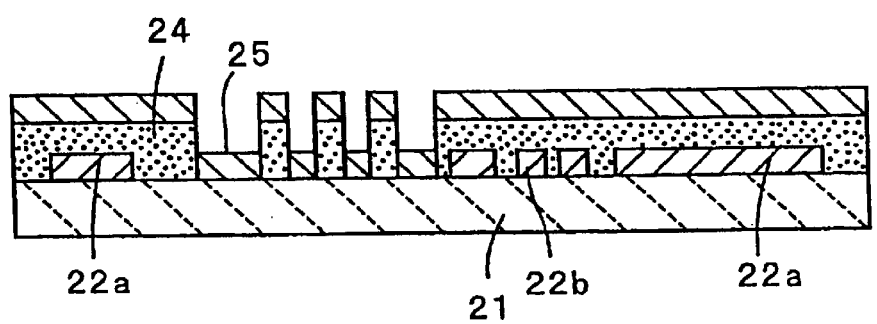

Subsequently, as shown in FIG. 7A, a resist pattern 24 is formed. The resist pattern 24 is formed on the piezoelectric substrate 21 at a portion except where an electrode for a second surface acoustic wave element is formed. A metal film 25 is formed over the entire top surface of the piezoelectric substrate 21 (FIG. 7B).

Figure 7C:
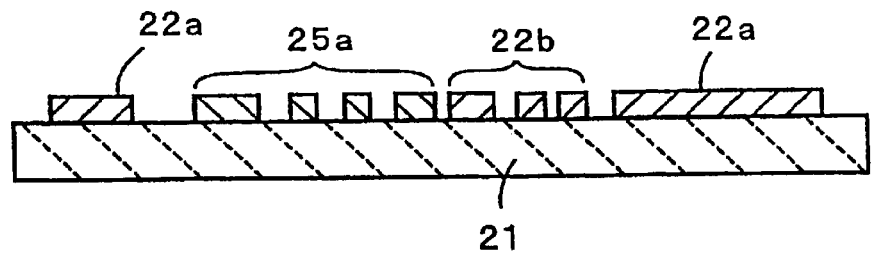

The resist pattern 24 and the metal film adhered thereon are removed preferably by the lift-off method. Thus, the electrode for the second surface acoustic wave element 25a is formed by the lift-off method as shown in FIG. 7C.

Figure 7D:
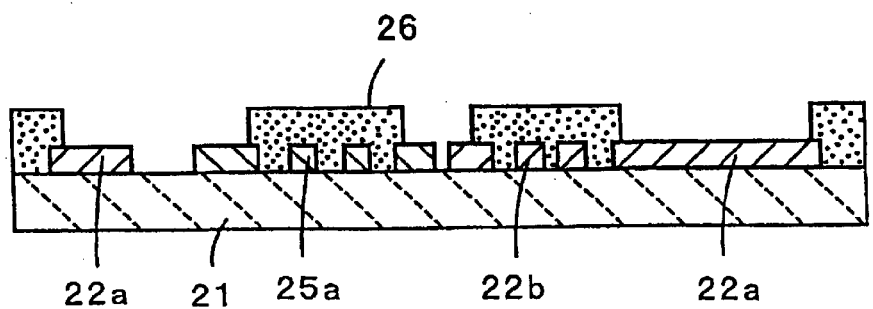

A resist pattern 26 is formed as shown in FIG. 7D. The resist pattern 26 is applied on the portion of the piezoelectric substrate 21 except where a second electrode layer and a wiring electrode are located.

Figure 8A:
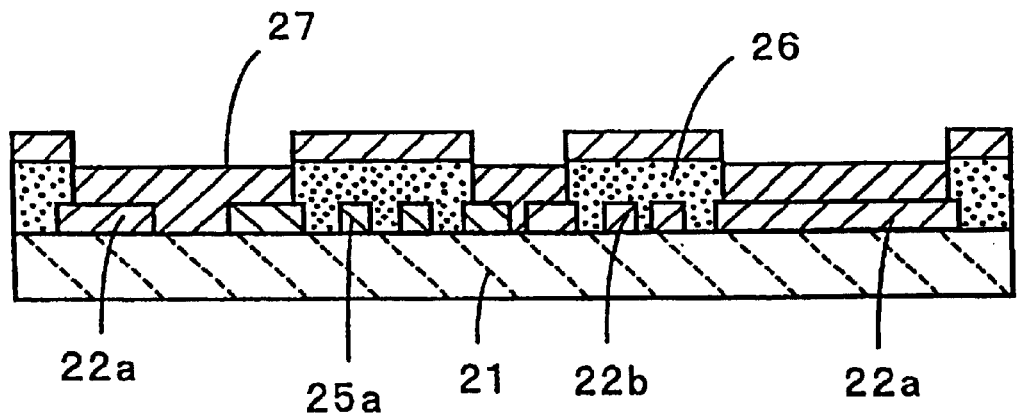
FIGS. 8A and 8B are sectional front views for explaining the steps in the manufacture of the surface acoustic wave apparatus according to the second preferred embodiment of the present invention.

A metal film 27 is formed over the entire top surface of the piezoelectric substrate 21 as shown in FIG. 8A. This metal film 27 is preferably formed from a material similar to that of the metal film 7 in the first preferred embodiment, and has a thickness nearly equivalent to that of the metal film 7.

Figure 8B:
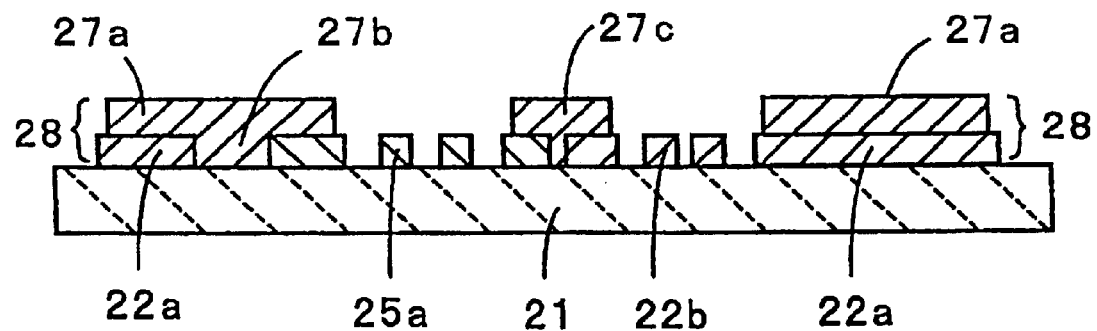

The resist pattern 26 and the metal film portion adhered thereon are removed preferably by the lift-off method as shown in FIG. 8B. Thus, a second electrode pad 27a and a wiring electrode 27b are formed. The wiring electrode 27b is simultaneously formed with the second electrode layer 27a while being joined to the second electrode layer 27a.

Furthermore, a wiring electrode 27c for electrically connecting the electrode for the first surface acoustic wave element formed by the etching method and the electrode for the second surface acoustic wave element formed by the lift-off method may also be formed simultaneously.

An electrode pad 28 preferably includes the second electrode layer 27a and the first electrode layer 22a formed beforehand.

Subsequently, bumps 29 are formed on the electrode pads 28 and, therefore, a surface acoustic wave apparatus 31 shown in FIG. 5 is produced.

In the surface acoustic wave apparatus 31 as well, since the first electrode layer 22a of the electrode pad is formed on the piezoelectric substrate 21 by etching, the adhesion between the electrode pad and the piezoelectric substrate is greatly increased in a manner similar to that in the first preferred embodiment of the present invention.

In addition to this, since the electrode for the first surface acoustic wave element 22b and the electrode for the second surface acoustic wave element 25a are formed by the etching method and lift-off method, respectively, the film thicknesses of these electrodes can be differentiated with ease, and a plurality of types of surface acoustic wave elements having different bands can be thereby formed with ease on the piezoelectric substrate 21. That is, dual filters having different bands, and other different characteristics, can be produced with ease.

The film thickness of the electrode is determined depending on the constraints relating to functions of the surface acoustic wave element. It is insignificant which film thickness is larger and, therefore, either may be larger, or both may be the same.

Figure 10A:
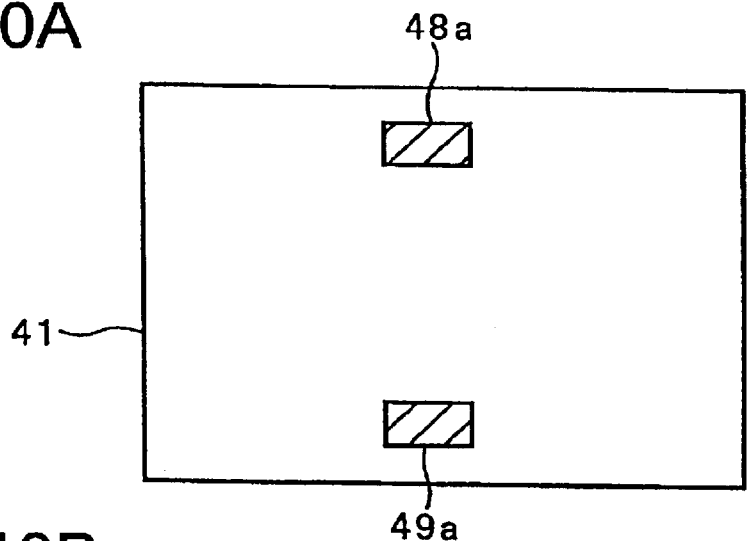
FIGS. 10A to 10C are schematic plan views for explaining the steps in the manufacture of the surface acoustic wave apparatus according to a third preferred embodiment of the present invention.
Figure 10B:
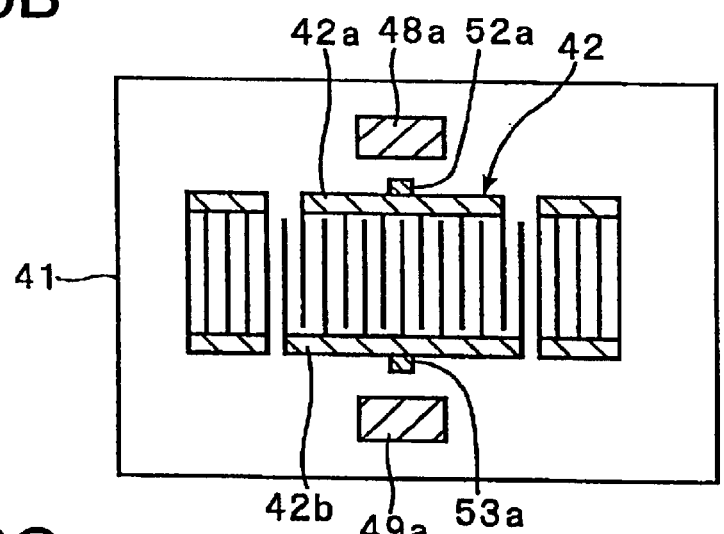
Figure 10C:
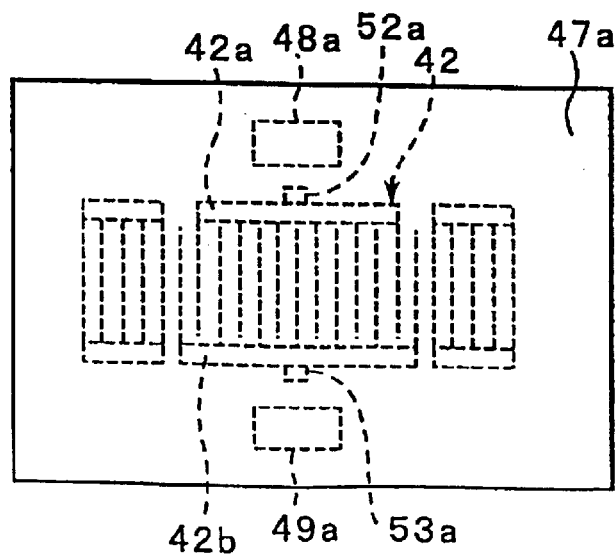
Figure 11A:
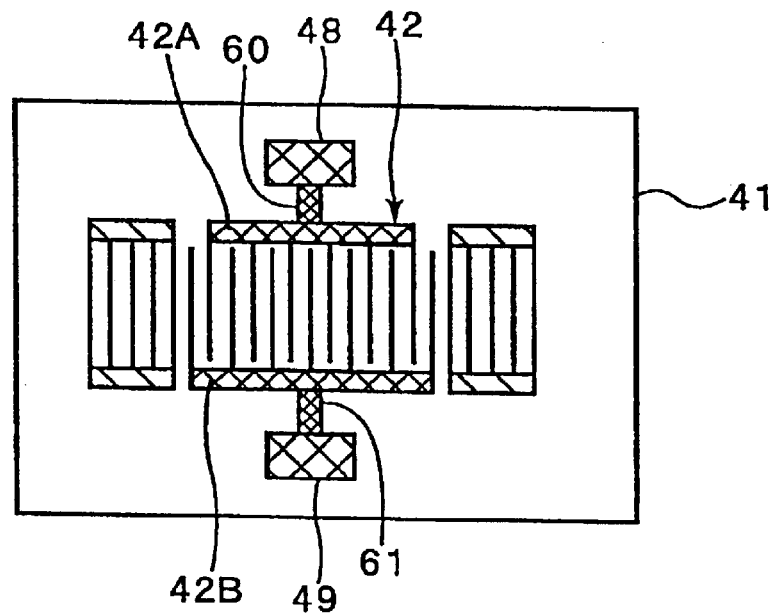
FIGS. 11A and 11B are schematic plan views for explaining the steps in the manufacture according to the third preferred embodiment of the present invention.
Figure 11B:
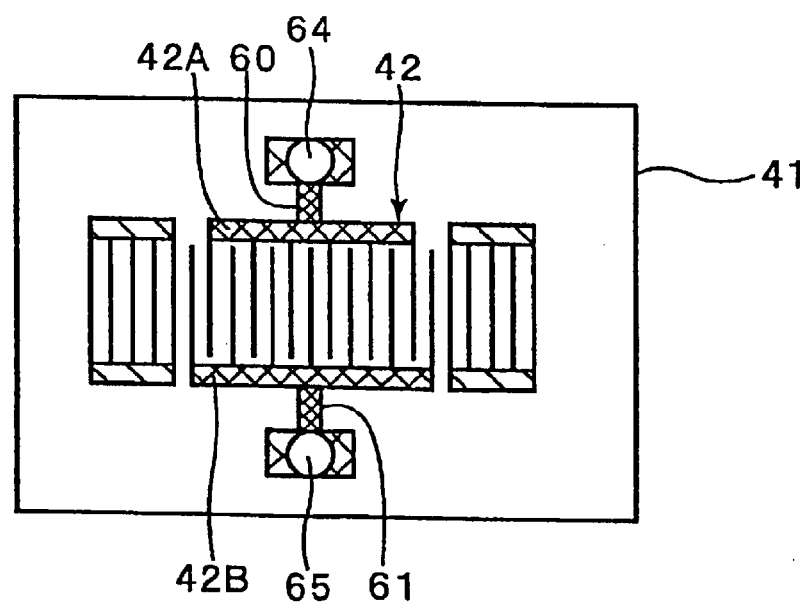

Each of FIGS. 11A to 10C and FIGS. 11A and 11B is a schematic plan view for explaining the method of manufacturing a surface acoustic wave apparatus according to a third preferred embodiment of the present invention. Each of FIGS. 12A to 12D and FIGS. 13A to 13C is a schematic sectional view for explaining the method of manufacturing according to the present preferred embodiment of the present invention.

In the present preferred embodiment, first electrode layers 48a and 49a constituting the electrode pads are formed on a piezoelectric substrate 41. The formation of the first electrode layers 48a and 49a is carried out as described below.

Figure 12A:
FIGS. 12A to 12D are sectional front views for explaining the steps in the manufacture of the surface acoustic wave apparatus according to the third preferred embodiment of the present invention.

A conductive film is formed over the entire surface of the piezoelectric substrate 41, and a positive type resist is applied over the entire surface thereof. Subsequently, exposure is performed using a mask that shields the portions of the first electrode layers 48a and 49a. The exposed resist portions are removed and therefore, the aforementioned resist is patterned. The conductive film is etched by carrying out the etching, and then, the resist is removed. The etching may be carried out by either a wet etching method or a dry etching method using plasma. As described above, the first electrode layers 48a and 49a shown in FIG. 10A and FIG. 12A are formed.

Figure 12B:
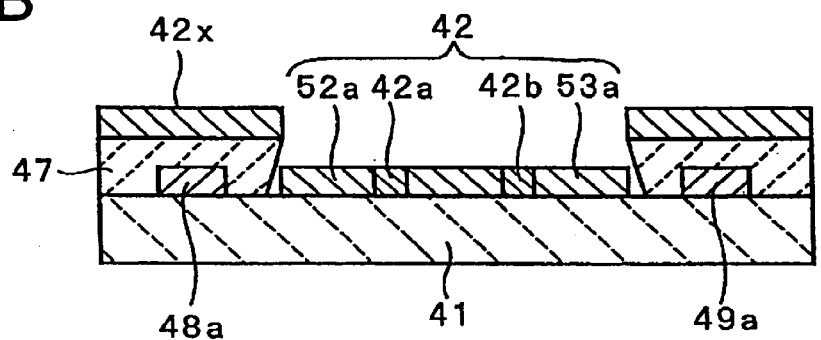

Thereafter, a negative type resist is applied over the entire top surface of the piezoelectric substrate 41. A mask that shields the portions where an electrode for the surface acoustic wave element and a wiring electrode are to be formed is put on the negative type resist, and exposure is performed. The resist portions not exposed are removed and therefore, the negative type resist is patterned. FIG. 12B shows the negative type resist 47 patterned as described above.

Figure 12C:
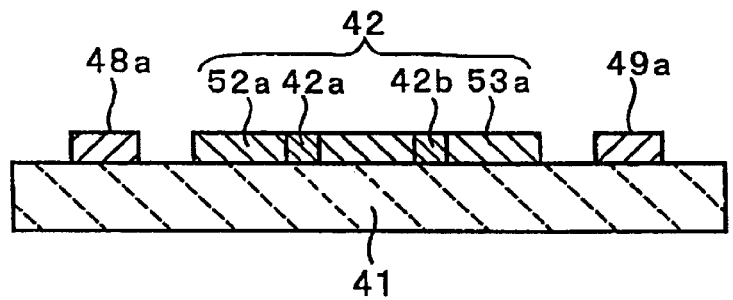

A conductive film is formed over the entire top surface of the piezoelectric substrate 41. This conductive film is preferably formed by applying a conductive material, such as Al, using an appropriate method, such as vapor deposition. The conductive film 42x on the resist 47 is removed together with the resist 47 by lift-off and, therefore, the aforementioned conductive film is patterned. Consequently, as shown in FIG. 10(b) and FIG. 12(c), an IDT 42 including bus bars 42a and 42b and electrode lands 52a and 53a, and reflectors are formed as an electrode for a surface acoustic wave element 42.

Figure 12D:
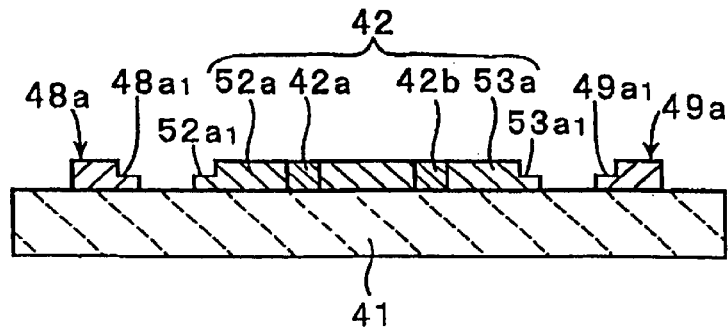

A positive type resist is applied over the entire top surface of the piezoelectric substrate 41. A mask that shields all of the positive type resist except for the joint portions of the electrode lands 52a and 53a and the electrode layers 48a and 49a, is put on the positive type resist, and exposure is performed. The joint portions of the electrode lands 52a and 53a and the electrode layers 48a and 49a refer to the end portions at the side where wiring electrodes described below are to be joined. Thereafter, the exposed resist is removed. Etching is carried out so that the joint portions of the electrode layers 48a and 49a and the joint portions of the electrode lands 52a and 53a defining electrodes for the surface acoustic wave element have stepwise end surfaces $48a_1$, $49a_1$, $52a_1$, and $53a_1$, respectively, as shown in FIG. 12D.

The etching for producing the stepwise end surfaces $48a_1$, $49a_1$, $52a_1$, and $53a_1$ may also be carried out by either a wet etching method or a dry etching method using plasma, or other suitable material and process.

Figure 13A:
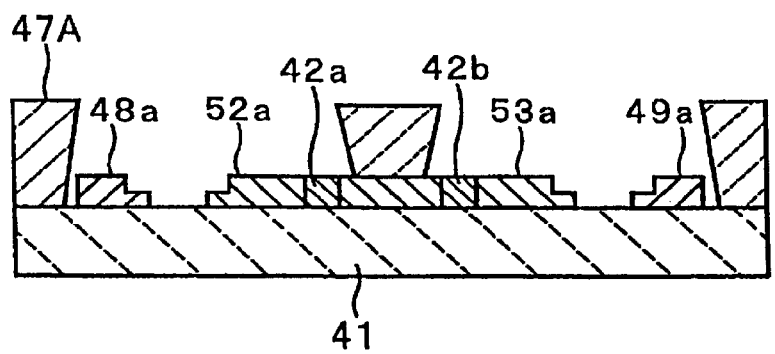
FIGS. 13A to 13C are sectional front views for explaining the steps in the manufacture of the surface acoustic wave apparatus according to the third preferred embodiment of the present invention.

A negative type resist 47A is applied over the entire top surface of the piezoelectric substrate 41 (FIG. 10C). A mask that shields the portions of the first and second electrode layers 48a and 49a, electrode lands 52a and 53a, and the bus bar 42a and 42b is put on the resist 47A, and exposure is performed. The resist portions not exposed are removed and therefore, the patterned resist 47A, as shown in FIG. 13A, is produced.

An intermediate layer (not shown in the drawing) made of a metal that is different from the electrode for the surface acoustic wave element and a conductive film having a film thickness that is larger than that of the electrode for the surface acoustic wave element are applied all over the top surface of the piezoelectric substrate 41. In this case, the particle diameter of the conductive particle in the conductive film arranged to define the upper layer is preferably smaller than that in the electrode layers 48a and 49a arranged to define the lower layers. The thickness of the aforementioned conductive film is preferably within the range of about 300 nm to about 1,000 nm in consideration of the wiring resistance and the joining strength between the bump and the electrode pad.

In order to increase the adhesion between the conductive film at the first layer and the conductive film at the second layer, Ti, Ni, NiCr, or other suitable material, are used as the aforementioned intermediate layer. The film formations of the aforementioned intermediate layer and the conductive film formed thereon are preferably carried out continuously. The intermediate layer is not indispensable.

Figure 13B:
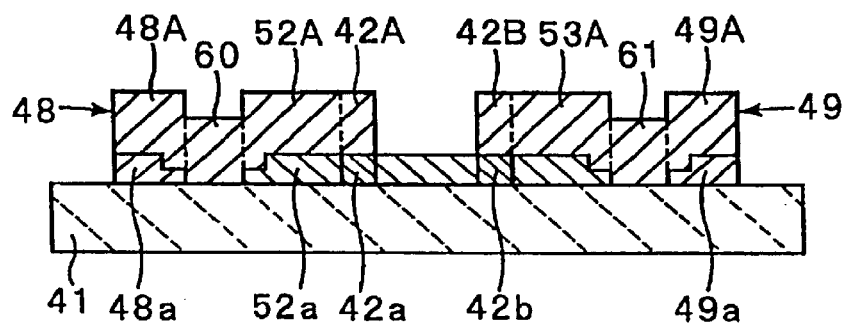

Subsequently, the intermediate layer and the conductive film applied on the resist 47A are removed together with the resist 47A preferably by a lift-off process. Thus, second electrode layers 48A and 49A, electrode layers 52A and 53A, and electrode layers 42A and 42B are formed on the first electrode layers 48a and 49a, the electrode lands 52a and 53a, and the bus bars 42a and 42b, respectively, as shown in FIG. 11A and FIG. 13B. The second electrode layers 48A and 49A, the electrode layers 52A and 53A, and the electrode layers 42A and 42B preferably include the intermediate layer and the conductive film.

An electrode pad 48 preferably includes the first electrode layer 48a and second electrode layer 48A, and an electrode pad 49 preferably includes the first electrode layer 49a and second electrode layer 49A. The electrode pads 48 and 49 and the electrode layers 52a and 53a of the electrode land are electrically connected, respectively, by wiring electrodes 60 and 61, respectively, made of the aforementioned conductive film. That is, the wiring electrodes 60 and 61 preferably include the same intermediate layer and conductive film as the second electrode layers 48A and 49A.

Figure 13C:
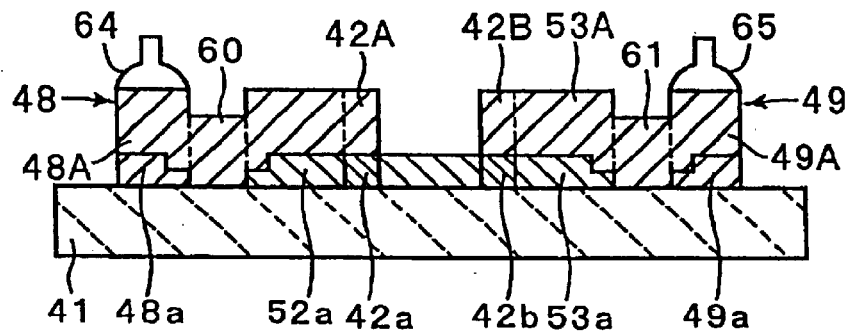

Bumps 64 and 65 are preferably formed on the electrode pads 48 and 49 as shown in FIG. 11B and FIG. 13C.

In the present preferred embodiment, since the IDT 42 that defines the electrode for the surface acoustic wave element is formed by the lift-off method, the electrode for the surface acoustic wave element having a high electrode precision and superior electric power resistance is produced.

Since the electrode pads 48 and 49, on which the bumps 64 and 65 are formed, include the first and second electrode layers, the first electrode layers 48a and 49a are formed by dry etching or wet etching, and the second electrode layers 48A and 49A including the intermediate layers that define substrates are formed, the occurrence of cracks caused by mechanical stress due to the residual stress and other influences, during the film formation is prevented in the piezoelectric substrate in areas near the electrode pads 48 and 49.

Figure 19:
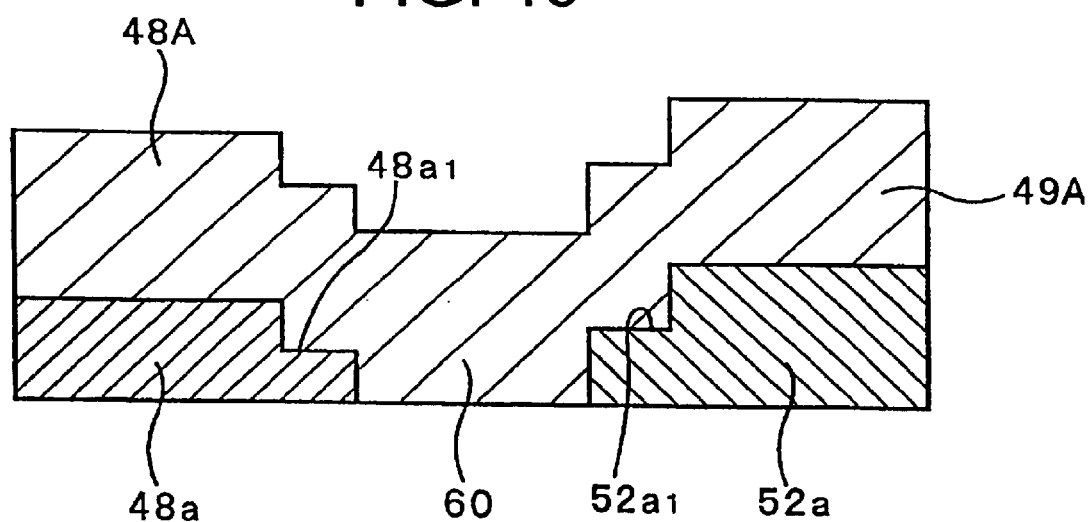
FIG. 19 is an enlarged partial sectional view for explaining the shapes of the end portions for joining a wiring electrode with an electrode pad and an electrode land according to the third preferred embodiment of the present invention.

Furthermore, the reliability of the electrical connection of the electrode pads 48 and 49 and the electrode lands 52a and 53a as the electrodes for the surface acoustic wave element with the wiring electrodes 60 and 61 is greatly increased. This is because the joint end portions of the first electrode layers 48a and 49a and the joint portions of the electrode lands 52a and 53a among the electrodes for the surface acoustic wave element have the stepwise end surfaces as described above, and therefore, the electrical connection is reliably achieved by the wiring electrodes 60 and 61 (refer to FIG. 19).

Figure 21:
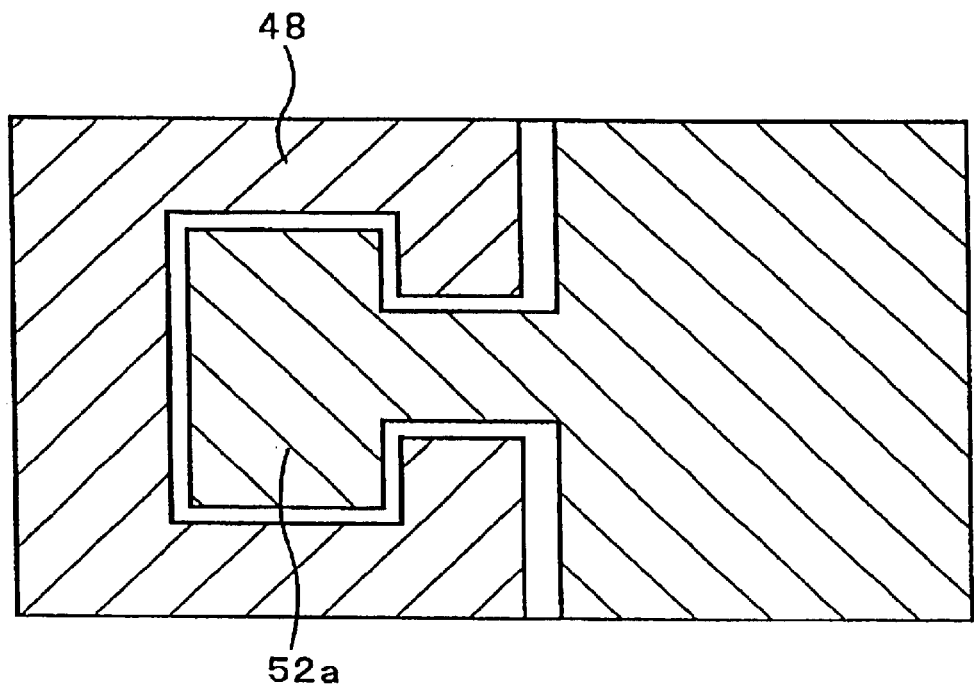
FIG. 21 is a partial plan view for explaining the shapes in plan of a first electrode layer of an electrode pad and a first electrode layer of an electrode land in a modified example based on the third preferred embodiment of the present invention.

In order to increase the reliability of the electrical connection between the electrode for the surface acoustic wave element and the electrode pad achieved by the wiring electrodes 60 and 61, as is shown in FIG. 21 with a partial plan view, the arrangement in which the electrode pad 48 and the electrode land 52*a* closely face to each other in a long region, is preferred. That is, in the configuration shown in FIG. 21, the electrode land 52*a* is arranged to enter into the inside of the electrode pad 48 and, therefore, the electrode pad 48 and the electrode land 52*a* closely face to each other for very long distances. Consequently, when the wiring electrodes 60 and 61 are formed therebetween with the conductive film, the reliability of the electrical connection is further increased.

In other words, each of the joint end portion of the electrode pad and the joint portion of the electrode for the surface acoustic wave element preferably includes at least two stepwise end surfaces. Consequently, the reliability of the electrical connection between the wiring electrode and the electrode pad or electrode for the surface acoustic wave element is further increased.

By making the particle diameters of the conductive particles in the aforementioned wiring electrode and in the second electrode layers 48A and 49A of the electrode pads 48 and 49 smaller than those of the first electrode layers 48*a* and 49*a*, the defects in the aforementioned electrically connected portion is reliably prevented. Consequently, the reliability of the electrical connection is even more increased.

Figure 17A:
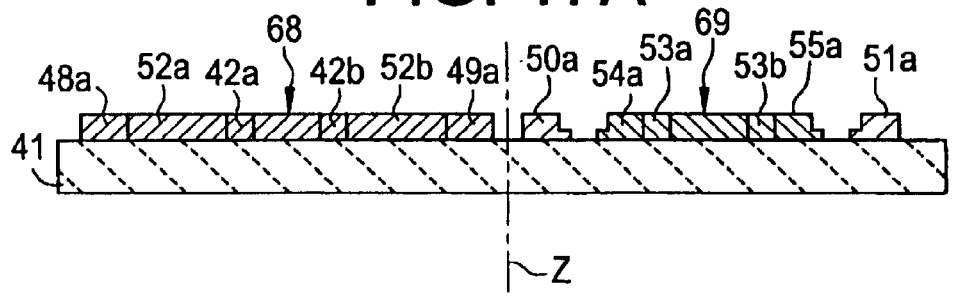
FIGS. 17A to 17C are schematic sectional side views for explaining the steps in the manufacture of the surface acoustic wave apparatus according to the fourth preferred embodiment of the present invention.
Figure 17B:
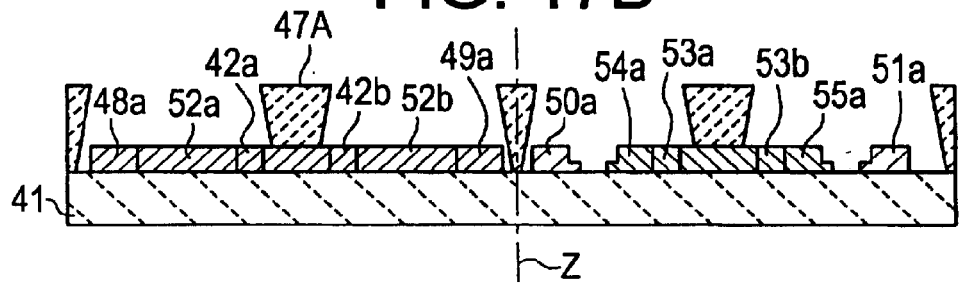
Figure 17C:
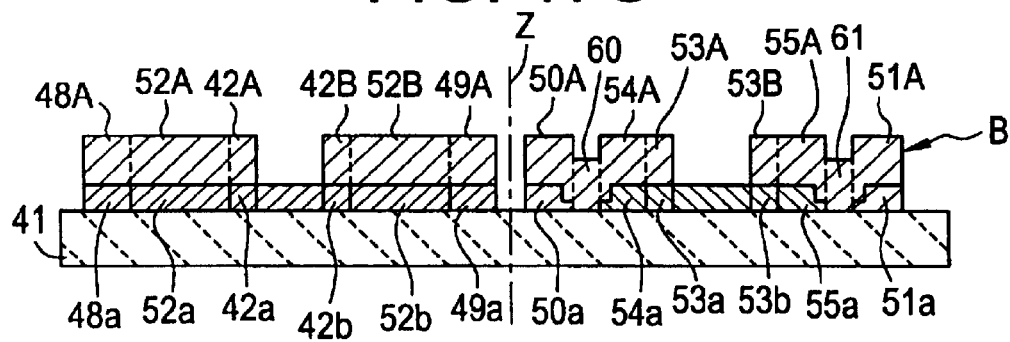
Figure 18:
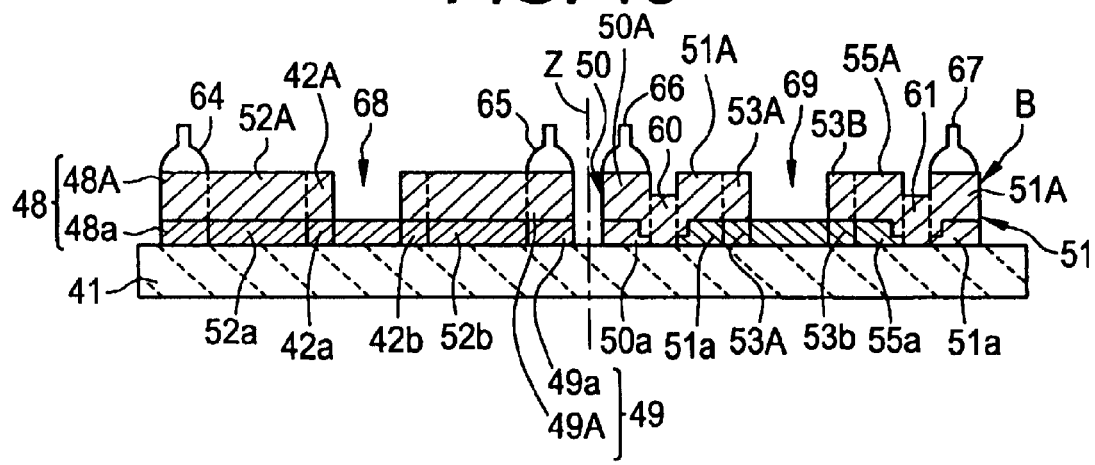
FIG. 18 is a schematic sectional side view for explaining the step in the manufacture of the surface acoustic wave apparatus according to the fourth preferred embodiment of the present invention.

FIGS. 14A to 15C are schematic plan views for explaining the method of manufacturing a surface acoustic wave apparatus according to a fourth preferred embodiment of the present invention. FIG. 16A to FIG. 18 are schematic sectional views for explaining the method of manufacturing a surface acoustic wave apparatus according to the fourth preferred embodiment of the present invention. In FIG. 16 to FIG. 18, sectional side views of a portion of the first and second surface acoustic wave elements 68 and 69 according to the present preferred embodiment are shown while being combined at the boundary indicated by an alternate long and short dashed line Z. The fourth preferred embodiment corresponds to a modified example of the third preferred embodiment of the present invention. Herein, the first and second surface acoustic wave elements having different bands are located on a piezoelectric substrate 41.

Figure 14A:
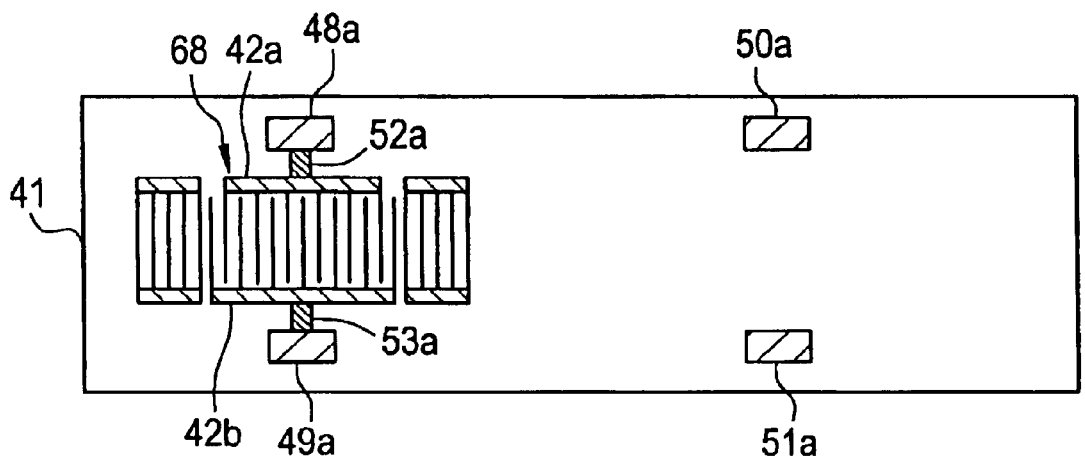
FIGS. 14A and 14B are schematic plan views for explaining the steps in the manufacture of the surface acoustic wave apparatus according to a fourth preferred embodiment of the present invention.
Figure 14B:
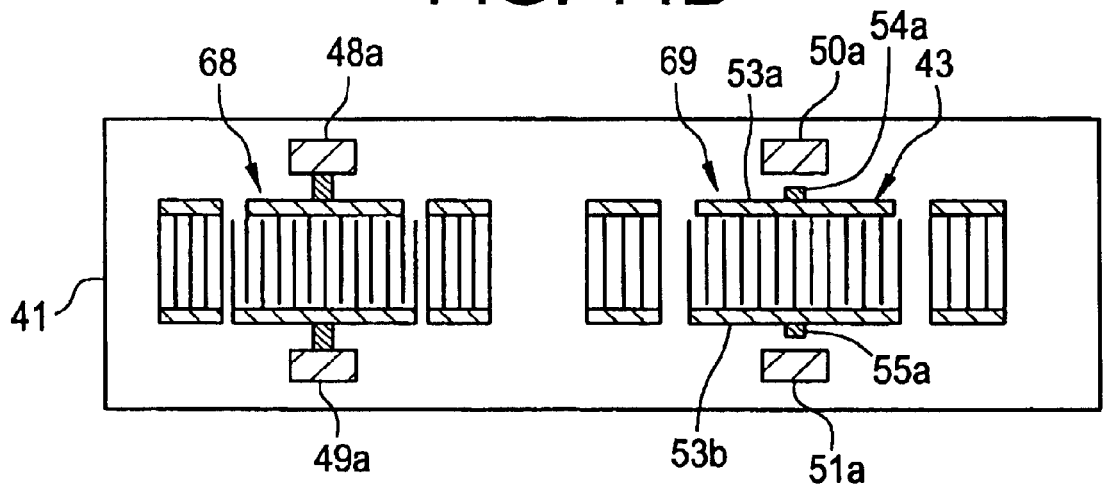

As shown in FIG. 14A, electrodes constituting the first surface acoustic wave element 68 and first electrode layers 50*a* and 51*a* of electrode pads of the second surface acoustic wave element 69 are disposed on the piezoelectric substrate 41. The electrodes at the first surface acoustic wave element 68 side include an electrode for surface acoustic wave element composed of bus bars 42*a* and 42*b*, electrode lands 52*a* and 53*a*, and electrode digits arranged between the bus bars 42*a* and 42*b*, the first electrode layers 48*a* and 49*a* of the electrode pads, and reflector electrodes. The bus bars 42*a* and 42*b*, electrode digits, and electrode lands 52*a* and 53*a* are the electrodes for the surface acoustic wave element.

When an electrode configuration shown in FIG. 14A is formed, a positive type resist is applied over the entire surface of the piezoelectric substrate 41. A mask shielding the portions of each electrode at the first surface acoustic wave element 68 side and the first electrode layers 50*a* and 51*a* at the second surface acoustic wave element 69 side is put on the positive type resist, and exposure is performed. By removing the exposed portions of the resist, the resist is patterned. Thereafter, by performing etching, the aforementioned electrode configuration is formed. The etching may be carried out by either a wet etching method or a dry etching method using plasma, or other suitable material.

Figure 16A:
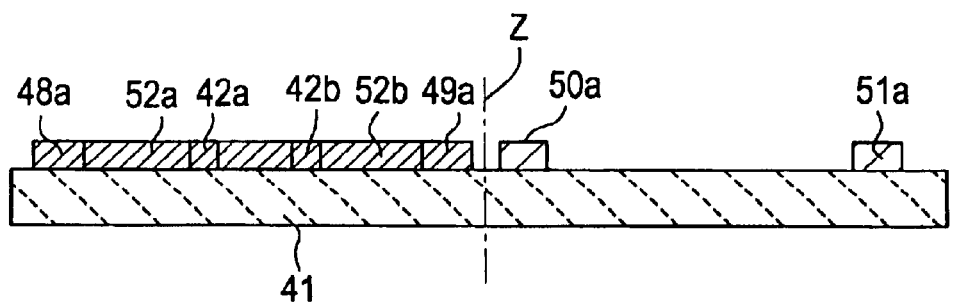
FIGS. 16A to 16D are schematic sectional side views for explaining the steps in the manufacture of the surface acoustic wave apparatus according to the fourth preferred embodiment of the present invention.

At the side of the first surface acoustic wave element 68 formed as described above, the electrode lands 52*a* and 53*a* are in contact with the first electrode layers 48*a* and 49*a*, respectively, (refer to FIG. 16A).

Figure 16B:
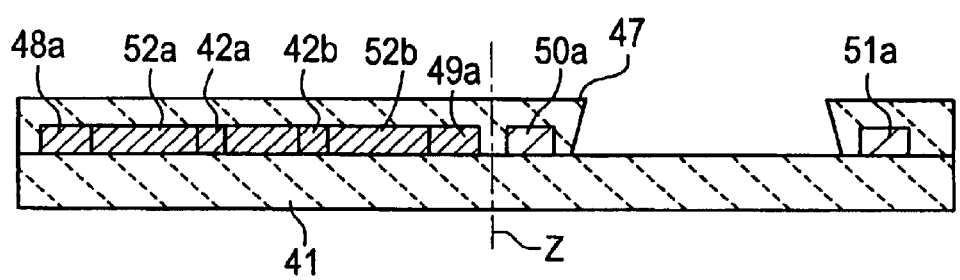

A negative type resist is applied over the entire surface thereof. A mask shielding the portions of an IDT 43, bus bars 53*c* and 53*b*, and electrode lands 54*a* and 55*a* at the second surface acoustic wave element 69 side shown in 14B is put on the resist, and exposure is performed. By removing the resist portions that are not exposed, a resist 47 patterned as shown in FIG. 16B is produced.

Figure 16C:
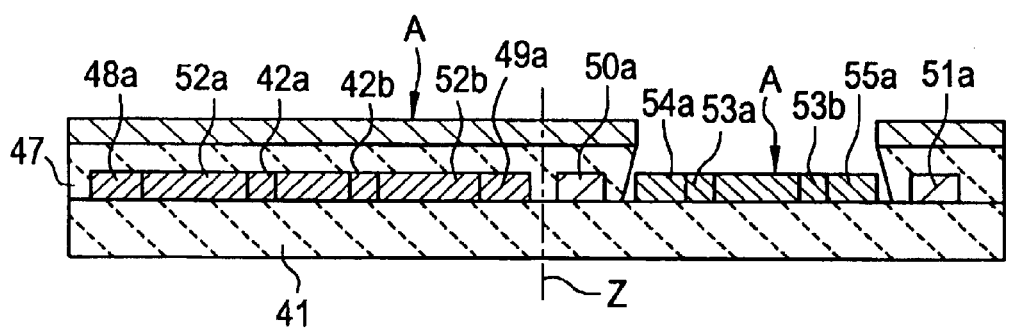

Subsequently, as shown in FIG. 16C, a conductive film A having a film thickness that is equivalent to the IDT 43 of the second surface acoustic wave element 69, etc., is applied over the entire top surface of the piezoelectric substrate 41. This conductive film A is preferably formed by the application of an appropriate conductive material, such as Al, using an appropriate method, such as vapor deposition.

Figure 16D:
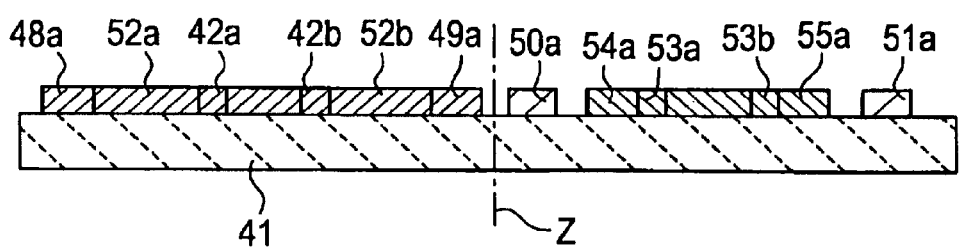

The conductive film A applied on the resist 47 is removed together with the resist 47 preferably by a lift-off process and, therefore, the IDT 43, bus bars 53*c* and 53*b*, and electrode lands 54*a* and 55*a* of the surface acoustic wave element 69 are formed (FIG. 16D).

A positive type resist is applied over the entire surface. A mask shielding the portions except for the joint portions of the electrode lands 54*a* and 55*a* and electrode layers 50*a* and 51*a* of the second surface acoustic wave element 69 is put on the resist, and exposure is performed. The exposed resist portions are removed. Thereafter, in the aforementioned joint portions, stepwise end surfaces are formed by etching, in a manner similar to that in the third preferred embodiment (refer to FIG. 17A) of the present invention.

The method for forming the electrodes for the surface acoustic wave element and the electrodes of the electrode pads in the aforementioned first and second surface acoustic wave elements 68 and 69 is not limited to that described above. For example, only a portion of the electrode layers of the electrode pads and electrode lands may be formed by wet etching or dry etching, and a portion of the IDTs and the electrode lands of the first and second surface acoustic wave elements may be formed by a lift-off process.

Figure 15A:
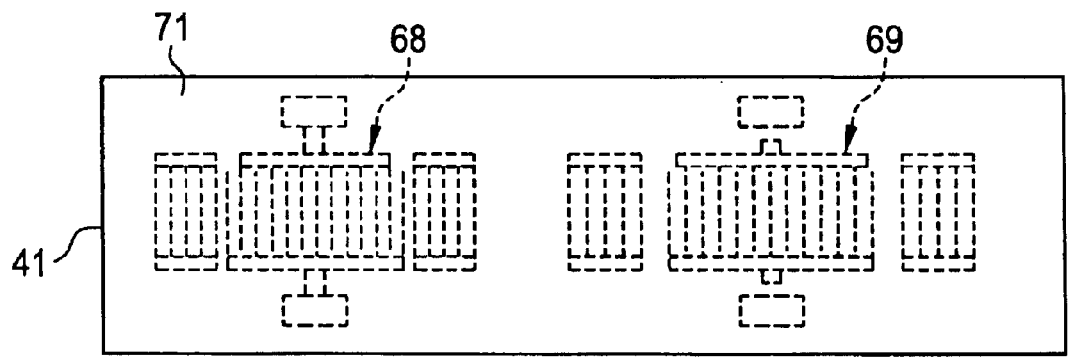
FIGS. 15A to 15C are schematic plan views for explaining the steps in the manufacture of the surface acoustic wave apparatus according to the fourth preferred embodiment of the present invention.

A negative type resist 71 is applied over the entire surface of the piezoelectric substrate 41 as shown in FIG. 15A. A mask shielding the portions of the electrode pads, the electrode lands 52*a*, 53*a*, 54*a* and 55*a*, and the bus bars 42*a*, 42*b*, 53*c* and 53*b* of the first and second surface acoustic wave elements 68 and 69 is put on the negative type resist 71, and exposure is performed. By removing the resist portions that are not exposed, a resist 47A patterned as shown in FIG. 17B is produced.

An intermediate layer, although not shown in the drawing, is preferably formed from a metal that is different from the metal used to form the electrode for the surface acoustic wave element. Subsequently, a conductive film B having a film thickness that is larger than those of the electrode layers 48*a*, 49*a*, 50*a*, and 51*a* is laminated on the intermediate layer. In this case, the particle diameter of the conductive particle in the upper layer is preferably smaller than that in the lower layer. That is, the particle diameter of the conductive particle in the most recently formed conductive film B is preferably smaller than the particle diameters of the conductive particles of the first electrode layers 48*a*, 49*a*, 50*a*, and 51*a*, etc.

The thickness of the most recently formed conductive film B is preferably within the range of about 300 nm to about 1,000 nm similarly to that in the third preferred embodiment of the present invention. The material constituting the aforementioned intermediate layer and the conductive film is similar to that used in the third preferred embodiment of the present invention.

Figure 15B:
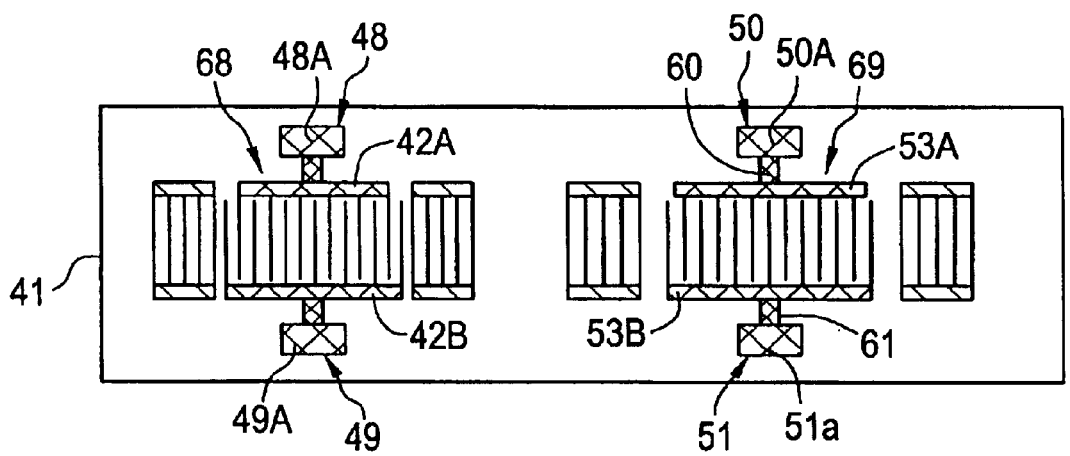

The conductive film applied on the resist 47A is removed together with the resist 47A preferably by a lift-off process. Consequently, the electrode layers 48A, 49A, 50A, 51A, 52A, 53A, 54A, 55A, 42A, 42B, 53C, and 53B shown in FIGS. 15B and 17C are formed on the electrode pads 48a, 49a, 50a, and 51a, electrode lands 52a, 53a, 54a and 55a, and bus bars 42a, 42b, 53c and 53b of the IDT of the first and second surface acoustic wave elements 68 and 69, respectively.

That is, electrode pads preferably include the first electrode layers 50a and 51a and the second electrode layers 50A and 51A at not only the first surface acoustic wave element 68 side, but also the second surface acoustic wave element 69 side.

As a result of the aforementioned lift-off process, the wiring electrodes 60 and 61 are formed from the conductive film including the intermediate layer, although not shown in the drawing, as a substrate in a manner similar to that in the third preferred embodiment of the present invention.

Figure 15C:
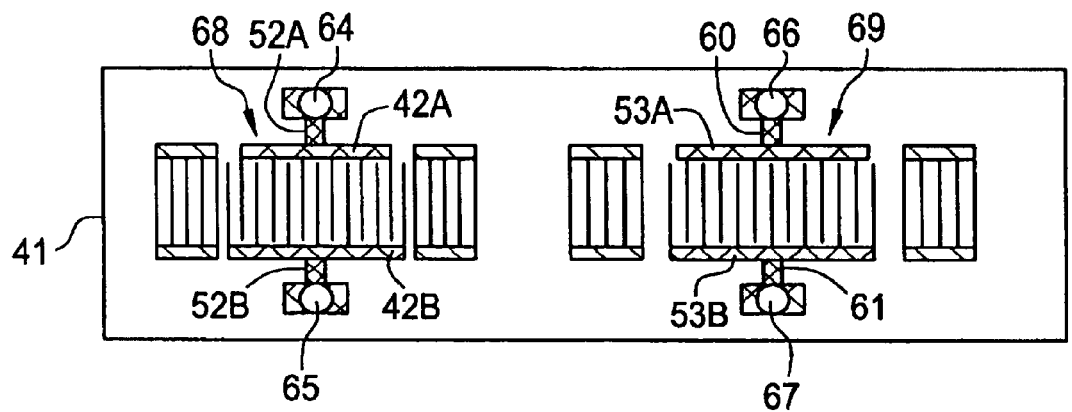

Finally, bumps 64 to 67 are formed on the electrode pads as shown in FIG. 15C and FIG. 18. As described above, regarding the manufacture of the surface acoustic wave apparatus including two surface acoustic wave elements 68 and 69 having different bands, since the electrode pads 48, 49, 50, and 51 for bumps are constituted as described above, the occurrence of cracks in the piezoelectric substrate in areas near the electrode pads 48 to 51 are reliably prevented.

In the fourth preferred embodiment as well, the end surfaces of the joint portions of the electrode pads 50 and 51 and the electrode lands 54a and 55a connected by the wiring electrodes 60 and 61 preferably have a stepwise configuration, the reliability in the electrical connection by the wiring electrodes is greatly increased. That is, since the contact areas with the wiring electrodes 60 and 61 are increased due to the first electrode layers 50a and 51a having the stepwise joint end surfaces, and the second electrode layers are integrally formed with the wiring electrodes 60 and 61 from the same conductive film, the reliability in the electrical connection can be effectively increased as described above.

Although the joint portions, that is, the joint end surfaces, of the electrode pads 50 and 51 for the bumps and the electrode lands 54a and 55a of the electrode for the surface acoustic wave element, which are connected with the wiring electrodes 60 and 61, are made to have the stepwise configurations, these may not have the stepwise configurations as is shown at the surface acoustic wave element 68 side.

Figure 20:
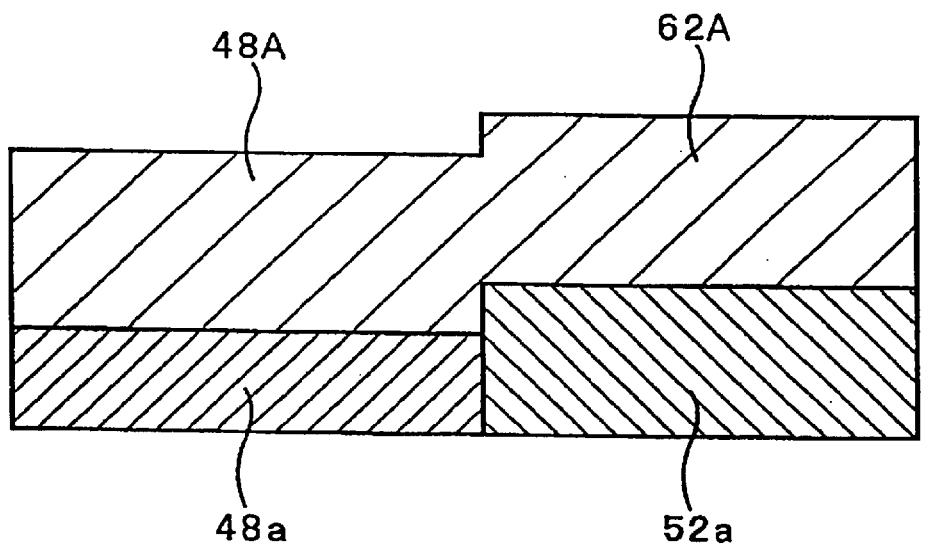
FIG. 20 is an enlarged partial sectional view showing the joint portion of a wiring electrode with an electrode land and an electrode pad in a modified example based on the third and fourth preferred embodiments of the present invention.

FIG. 20 shows the joint portion between the electrode pad 48 and the electrode land 52a in the fourth preferred embodiment under magnification. Herein, the joint portion of the first electrode layer 48a of the electrode pad 48 is in contact with the joint portion of the electrode for the surface acoustic wave element side, that is, the joint portion of the electrode land 52a. Therefore, when the second electrode layer 48A and the wiring electrode 62A are simultaneously formed from the same conductive film, the electrode pad 48 and the electrode land 52a of the electrode for surface acoustic wave element are electrically connected with high reliability. In particular, as is shown in FIG. 20, when the film thicknesses of the first electrode layer 48a of the electrode pad 48 and the first electrode layer 52a of the electrode land are different from each other, a height difference is generated at the portion where these elements contact with each other and, therefore, the reliability in the electrical connection by the wiring electrode is further increased.

Consequently, in the third preferred embodiment as well, the electrode pads and the electrode lands may be formed to have a structure that is similar to that at the surface acoustic wave element 68 side in the fourth preferred embodiment instead of the formation of the stepwise end surfaces. In addition, the reliability of the electrical connection achieved by the wiring electrode is greatly increased.

Although in the aforementioned preferred embodiments, the electrode for the surface acoustic wave element and the electrode pads are formed in order to constitute one surface acoustic wave apparatus on each of the piezoelectric substrates 1, 21, and 41, usually, electrodes for the surface acoustic wave element and electrode pads of a plurality of surface acoustic wave apparatuses are formed on a mother piezoelectric substrate according to each of the aforementioned preferred embodiments, and finally, an individual surface acoustic wave apparatus is produced by dicing or other method for division of a component from a mother substrate.

In the present invention, the configuration of the electrode for surface acoustic wave element is not specifically limited, and the present invention can be applied to manufacture not only surface acoustic wave filters, but also various surface acoustic wave apparatuses, such as surface acoustic wave resonators and surface acoustic wave delay lines.

According to the first preferred embodiment of the present invention, the first electrode layer may be formed by etching, and the electrode for the surface acoustic wave element may be formed by the lift-off method after the step of forming the first electrode layer. Subsequently, when the second electrode layer of the electrode pad is formed on the first electrode layer, the first electrode layer is formed on the piezoelectric substrate that is not soiled by photolithography residue or other debris. Therefore, the adhesion between the electrode pad and the piezoelectric substrate is greatly increased effectively. In addition, since the electrode pad has a structure in which the first and second electrode layers are laminated, peeling between the electrode pad and the piezoelectric substrate is prevented from occurring during the formation of the bumps or during the mounting of the surface acoustic wave apparatus into the package by the flip chip bonding system via the bumps. Likewise, cracks in the piezoelectric substrate in areas near the electrode pad are also prevented from occurring. Therefore, the surface acoustic wave apparatus having superior reliability is produced.

Since each of the surface acoustic wave apparatuses according to the second to fourth preferred embodiments of the present invention is preferably produced in accordance with the manufacturing method according to the first preferred embodiment, the reliability of the electrical connection of the wiring electrodes with the electrode for surface acoustic wave element and the electrode pads is greatly increased.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method of manufacturing a surface acoustic wave apparatus, comprising the steps of:
    preparing a piezoelectric substrate;
    forming a first electrode layer of an electrode pad on the piezoelectric substrate;

forming at least one electrode for a surface acoustic wave element after the step of forming the first electrode layer;

forming a second electrode layer of the electrode pad after the step of forming the electrode for the surface acoustic wave element; and forming a wiring electrode for electrically connecting the electrode pad and the electrode for the surface acoustic wave element.

2. The method according to claim 1, wherein the wiring electrode is simultaneously formed with the second electrode layer.

3. The method according to claim 1, further comprising the step of forming an adhesive layer as a substrate prior to the formation of the wiring electrode and the second electrode layer, wherein the wiring electrode and the second electrode layer are made of one of Al and an Al alloy, and the adhesive layer is made of one of a metal or an alloy having an adhesion to the first electrode layer that is higher than that of the Al and the Al alloy.

4. The method according to claim 1, further comprising the step of performing etching in order to form stepwise end surfaces at joint portions, to be connected with the wiring electrode, of the electrode for the surface acoustic wave element and the electrode pad, after the step of forming the electrode for the surface acoustic wave element, wherein the wiring electrode for electrically connecting the electrode for the surface acoustic wave element and the first electrode layer of the electrode pad and the second electrode layer of the electrode pad are simultaneously formed from the same conductive film.

5. The method according to claim 1, wherein each of the electrode for the surface acoustic wave element and the first electrode layer of the electrode pad includes at least two end surfaces of the joint portion.

6. The method according to claim 1, wherein the electrode for the surface acoustic wave element to be connected with the electrode pad is formed such that the end surface of the electrode for the surface acoustic wave element is in contact with the first electrode layer of the electrode pad in the step of forming the electrode for the surface acoustic wave element.

7. The method according to claim 1, wherein a particle diameter of a conductive particle in the conductive film constituting the wiring electrodes and the second electrode layer is smaller than a particle diameter of a conductive particle in one of the electrode for the surface acoustic wave element and the first electrode layer, which has a smaller film thickness.

8. The method according to claim 1, wherein the electrode for the surface acoustic wave element is formed by a lift-off method and the first electrode layer of the electrode pad is formed by etching.

9. The method according to claim 1, wherein at least one electrode for a second surface acoustic wave element that is different from the electrode for the surface acoustic wave element is simultaneously formed with the first electrode layer in the step of forming the first electrode layer.

* * * * *